United States Patent
Nainani et al.

(10) Patent No.: US 8,933,488 B2
(45) Date of Patent: Jan. 13, 2015

(54) HETEROSTRUCTURE FIELD EFFECT TRANSISTOR WITH SAME CHANNEL AND BARRIER CONFIGURATION FOR PMOS AND NMOS

(75) Inventors: Aneesh Nainani, Palo Alto, CA (US); Krishna Chandra Saraswat, Saratoga, CA (US)

(73) Assignee: The Board of Trustees of the Leland Stanford Junior Univerity, Palo Alto, CA (US)

( * ) Notice: Subject to any disclaimer, the term of this patent is extended or adjusted under 35 U.S.C. 154(b) by 0 days.

(21) Appl. No.: 13/309,316

(22) Filed: Dec. 1, 2011

(65) Prior Publication Data

US 2012/0138899 A1 Jun. 7, 2012

Related U.S. Application Data

(60) Provisional application No. 61/419,682, filed on Dec. 3, 2010.

(51) Int. Cl.
| | |
|---|---|
| *H01L 29/20* | (2006.01) |
| *H01L 29/10* | (2006.01) |
| *H01L 29/66* | (2006.01) |
| *H01L 29/80* | (2006.01) |
| H01L 21/02 | (2006.01) |
| H01L 29/51 | (2006.01) |

(52) U.S. Cl.
CPC ...... *H01L 29/1054* (2013.01); *H01L 29/66462* (2013.01); *H01L 29/802* (2013.01); *H01L 2924/10348* (2013.01); *H01L 21/02395* (2013.01); *H01L 21/02466* (2013.01); *H01L 21/02502* (2013.01); *H01L 21/02549* (2013.01); *H01L 29/517* (2013.01)
USPC .......... 257/200; 257/201; 257/E29.249; 257/E21.126; 257/E21.386

(58) Field of Classification Search
CPC .............. H01L 2924/1032; H01L 2924/10348
USPC .......... 257/189, 200, 201, E29.249, E21.126, 257/E21.386, E21.405
See application file for complete search history.

(56) References Cited

U.S. PATENT DOCUMENTS

| | | | | |
|---|---|---|---|---|
| 5,023,674 | A * | 6/1991 | Hikosaka et al. | 257/192 |
| 5,349,214 | A * | 9/1994 | Tehrani et al. | 257/192 |
| 6,498,354 | B1 * | 12/2002 | Jefferson et al. | 257/24 |

(Continued)

OTHER PUBLICATIONS

Lau, W. M. et al. "Capping and Decapping of InP and InGaAs Surfaces." Journal of Applied Physics 67 (2), pp. 768-773. Jan. 15, 1990.*

(Continued)

*Primary Examiner* — Tom Thomas
*Assistant Examiner* — Christopher M Roland
(74) *Attorney, Agent, or Firm* — Crawford Maunu PLLC

(57) ABSTRACT

In accordance with one or more embodiments, an apparatus and method involves a channel region, barrier layers separated by the channel region and a dielectric on one of the barrier layers. The barrier layers have band gaps that are different than a band gap of the channel region, and confine both electrons and holes in the channel region. A gate electrode applies electric field to the channel region via the dielectric. In various contexts, the apparatus and method are amenable to implementation for both electron-based and hole-based implementations, such as for nmos, pmos, and cmos applications.

36 Claims, 26 Drawing Sheets

(56) References Cited

U.S. PATENT DOCUMENTS

| | | | |
|---|---|---|---|
| 8,064,239 | B2 | 11/2011 | Ertosun et al. |
| 2001/0043636 | A1* | 11/2001 | Bewley et al. ............... 372/70 |
| 2008/0116485 | A1* | 5/2008 | Hudait et al. ............... 257/192 |
| 2011/0297916 | A1* | 12/2011 | Bennett et al. ............... 257/24 |

OTHER PUBLICATIONS

E.H. Nicollian and A. Goetzberger, "*The Si—SiO₂ Interface—Electrical Properties as Determined by the Metal-Insulator-Silicon Conductance Technique*," Bell System and Technical Journal, vol. 46, No. 6, pp. 1055-1133 (1967).

B. Bennett, R. Magno, J. Boos, W. Kruppa, and M. Ancona, "*Antimonide-based compound semiconductors for electronic devices: A review*," Solid-State Electronics 49, 1875 (2005).

J.B. Boos, B.R. Bennett, N.A. Papanicolaou, M.G. Ancona, J.G. Champlain, R. Bass and B.V. Shanabrook, "*High mobility p-channel HFETs using strained Sb-based materials*," Electronics Letters vol. 43, No. 15, pp. 834-835 (Jul. 19, 2007).

M. Passlack, P. Zurcher, K. Rajagopalan, R. Droopad, J. Abrokwah, M. Tutt, Y.B. Park, E. Johnson, O. Hartin, A. Zlotnicka, P. Fejes, R.J.W Hill, D.A.J. Moran, X. Li, H. Zhou, D. Macintyre, S. Thorns, A. Asenov, K. Kalna and I.G. Thayne, "*High Mobility III-V MOSFETs for RF and Digital Applications*," International Electron Device Meeting 2007, pp. 621-624 (2007).

B. R. Bennett, M.G. Ancona, J.B. Boos, C.B. Canedy, and S.A. Khan, "*Strained GaSb/AlAsSb quantum wells for p-channel field-effect transistors*," Journal of Crystal Growth, 311, pp. 47-53 (2008).

J. Ho et. al, "*Nanoscale doping of InAs via sulfur monolayers*," Applied Physics Letters, 95, pp. 072108-1-072108-3 (2009).

J. Ho et. al, "*Wafer-Scale, Sub-5 nm Junction Formation by Monolayer Doping and Conventional Spike Annealing*," Nano Letters, 9 (2), pp. 725-730 (2009).

A. Nainani, Ze Yuan, T. Krishnamohan and K. Saraswat, "*Optimal Design of III-V Heterostructure MOSFETs*," Proceedings of SISPAD 2010, pp. 103-106 (2010).

N.V. Nguyen, M. Xu, O.A. Kirillov, P.D. Ye, C. Wang, K. Cheung and J. S. Suehle, "*Band offsets of $Al_2O_3/In_xGa_{1-x}$ (x=0.53 and .075) and the effects of postdeposition annealing*," Applied Physics Letters, 96 (5), 052107 (2010).

A. Nainani, J. Yum, J. Barnett, R. Hill, N. Goel, J. Huang, P. Majhi, R. Jammy and K. Saraswat, "*Study of piezoresistance under unixial stress for technologically relevant III-V semiconductors using wafer being experiments*," Applied Physics Letters, 96, 242110 (2010).

M. Rodwell et al., "*III-V FET Channel Designs for High Current Densities and Thin Inversion Layers*," Device Research Conference (DRC), pp. 149-152 (2010).

A. Nainani et al. "*Development of high-k dielectric for Antimonides and a sub 350°C. III-V pMOSFET outperforming Germanium*," International Electron Devices Meeting (IEDM), San Francisco, 4 pgs. (Dec. 6-8, 2010).

A. Nainani, "*High Performance III-V PMOSFET*," Ph.D. Thesis, Stanford University, 15 pgs. (May 2011).

A. Nainani et al. "*Optimization of the $Al_2O_3$/GaSb Interface and a High-Mobility GaSb pMOSFET*." IEEE Transactions on Electron Devices, vol. 58, No. 10, p. 3407-3415 (Oct. 2011).

A. Nainani et al. "*$In_xGa_{1-x}$SB channel p-metal-oxide-semiconductor field effect transistors: Effect of strain and heterostructure design*." Journal of Applied Physics 110, p. 014503-1-014503-9 (Jul. 2011).

A. Nainani et al. "*Device quality Sb-based compound semiconductor surface: A comparative study of chemical cleaning*." Journal of Applied Physics 109, p. 114908-1-114908-7 (Jun. 2011).

* cited by examiner

HETEROSTRUCTURE FIELD EFFECT TRANSISTOR WITH SAME CHANNEL AND BARRIER CONFIGURATION FOR PMOS AND NMOS

RELATED DOCUMENTS

This patent document claims benefit under 35 U.S.C. §119 to U.S. Provisional Patent Application Ser. No. 61/419,682, entitled "Sb-Channel Transistors" and filed on Dec. 3, 2010; this patent document and the Appendices filed in the underlying provisional application, including the references cited therein, are fully incorporated herein by reference.

BACKGROUND

Insulated gate and transistor type devices have been increasingly used in multitudes of applications. Many applications benefit from various characteristics relating to one or more of channel operation, mobility, threshold voltage operation, on/off current, varied material implementations and scalability. However, scaling and performance characteristics can be challenging to achieve, particularly when coupled together.

SiGe, Ge, SnGe and III-V semiconductors materials, such as GaAs, InGaAs, InAs, InSb, GaSb, InGaSb, have been used to achieve performance gain and other desirable aspects of transistors and transistor applications. However, transistors made with these materials have been plagued by various challenges including those relating to interfaces between materials, confinement of both electrons and holes, transport properties for both electrons and holes, and other scaling considerations.

These and other aspects continue to present challenges to the design and implementation of insulated gate devices.

SUMMARY

Various example embodiments are directed to insulated gate structures, and to addressing various challenges including those discussed above.

In accordance with various example embodiments, a semiconductor material includes a channel region and barrier layers on opposing sides of the channel region, with the barrier layers configured and arranged to confine electrons and holes to facilitate operation of the channel as a heterostructure implementable with both nmos and pmos circuits.

A more particular example embodiment is directed to a semiconductor apparatus having a channel region and first and second barrier layers separated by the channel region. The first and second barrier layers have band gaps that are different than a band gap of the channel region. The channel region and barrier layers are configured to pass electrons and holes carriers for n-type and p-type semiconductor devices respectively.

In accordance with another embodiment, a semiconductor apparatus includes an channel region, a dielectric, first and second barrier layers separated by the channel region and with the second layer between the dielectric and the channel region, and a gate electrode that applies an electric field to the channel region via the dielectric. The first and second barrier layers have band gaps that are different than a band gap of the channel region, and confine both electrons and holes in the channel region. In this context, the channel region may be implemented to facilitate high-mobility structures of one or both of n-type and p-type circuits. Moreover, the channel region can be used in both n-type and p-type devices in a common layer stack.

Another example embodiment is directed to a field-effect transistor including a channel region, source/drain regions separated by the channel region and first and second barrier layers separated by the channel region. The transistor also includes an interface layer on the second barrier layer, a dielectric layer over the interface layer, and a gate electrode over the dielectric layer. The first and second barrier layers have band gaps that are different than a band gap of the channel region, and confine both electrons and holes in the channel region. The first and second barrier layers also have a crystalline lattice structure that is different than a crystalline lattice structure of the channel region, which introduces strain to the channel region. The interface layer mitigates oxidation of the second barrier layer and forms a quantum well therewith, to mitigate the effect of interface states at an interface between the dielectric and the second barrier layer. The gate electrode applies an electric field to the channel region to switch the channel region between conductance states for electrically coupling the source/drain regions (e.g., in response to positive or negative voltages, depending upon the conductivity type of the transistor).

Another example embodiment is directed to a method for manufacturing a semiconductor apparatus. A first barrier layer is formed, a channel region is formed on the first barrier layer, and a second barrier layer is formed on the channel region. The first and second barrier layers are formed with band gaps that are different than a band gap of the channel region, and respectively confine both electrons and holes in the channel region. The first and second barrier layers are also formed having a crystalline lattice structure that is different than a crystalline lattice structure of the channel region, to introduce strain to the channel region via the lattice structure mismatch. Oxides are removed from the second barrier layer, and an interfacial layer is formed on the second barrier layer. A dielectric is formed on the interfacial layer, and an electrode is formed on the dielectric.

The above discussion is not intended to describe each embodiment or every implementation of the present disclosure. The figures and following description also exemplify various embodiments.

BRIEF DESCRIPTION OF THE DRAWINGS

The invention may be more completely understood in consideration of the following detailed description of various embodiments of the invention in connection with the accompanying drawings, in which.

Figure 1A:
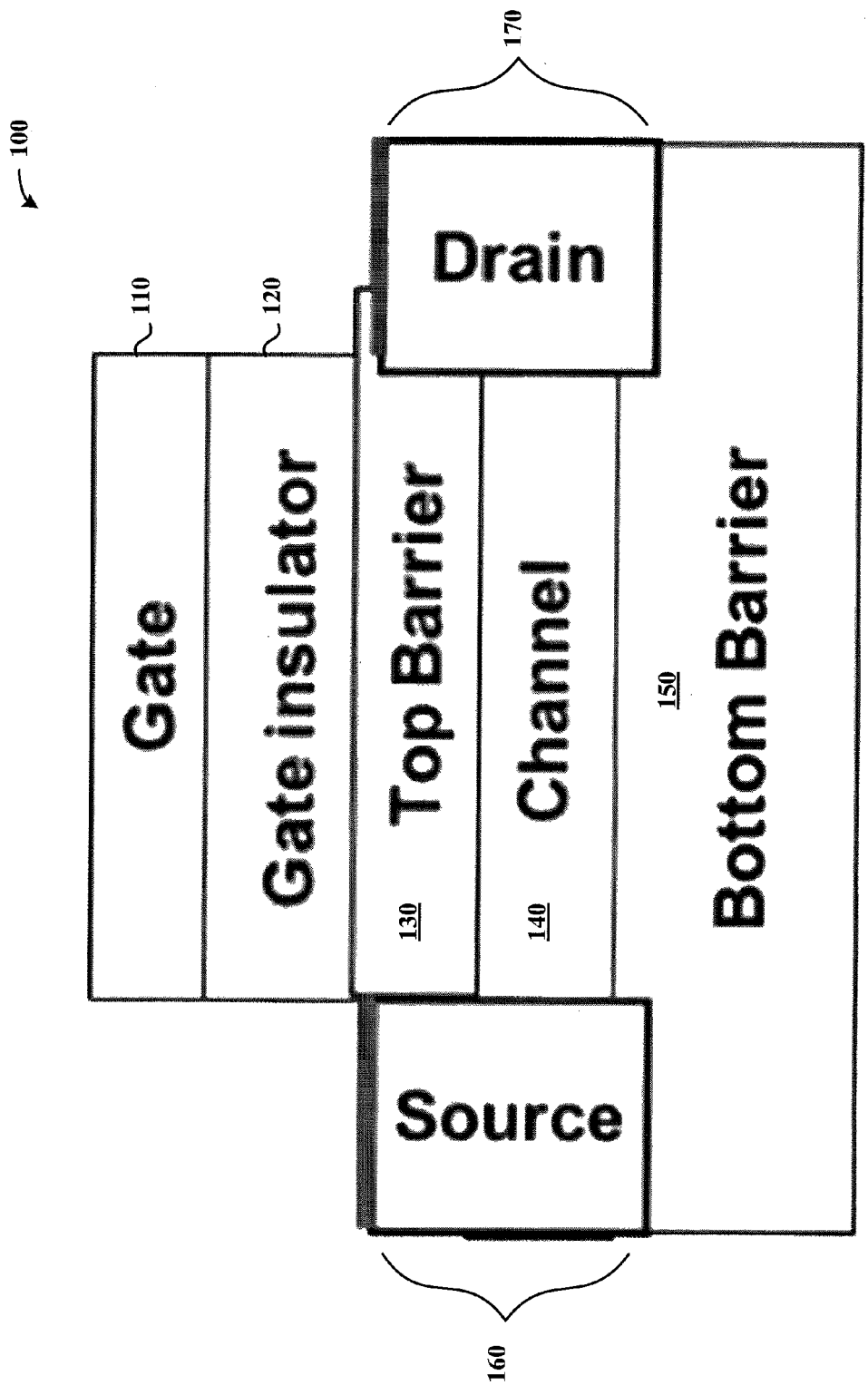
FIG. 1A shows a semiconductor device, in accordance with an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

DETAILED DESCRIPTION

The present disclosure is related to methods, applications and devices involving and relating to semiconductor devices, such as those involving uses and development of Field-Effect Transistors (FET) employing semiconductor materials. Particular embodiments are related to FETs that utilize a heterostructure design using different semiconductor materials which have similar lattice constants but different bandgaps. Various aspects of the present disclosure are also related to methods, applications and devices in and stemming from the disclosures in the above-identified provisional patent application to which benefit is claimed and which is fully incorporated herein by reference, and including aspects of the application described and/or shown in Appendices A and B that form part of the application.

Various example embodiments are directed to an apparatus having a semiconductor material acting as the channel region of the transistor surrounded on the top and bottom by barrier layers made of different semiconductor materials. In one embodiment, a semiconductor device includes a channel region that separates barrier layers having band gaps that are different than a band gap of the channel region. The barrier layers and channel region function to pass electrons and holes as the carriers for both n-type and p-type semiconductor devices, and can be implemented with both types of devices in a common apparatus (e.g., with the respective layers formed in a common stack). In some instances, the barrier layers are nearly (but not quite) lattice matched with the channel region, thus exhibiting relative crystalline lattice constants that cause an induced strain (e.g., 1%) in the channel region and facilitate both electron and hole mobility therein. In certain embodiments, an interfacial layer is located on one of the barrier layers, separating the barrier layer from a dielectric material and forming a quantum well that mitigates the effect of interface traps.

Many embodiments employ Sb-based semiconductor materials for forming the channel and barrier layers. In one implementation, such a material is used as the channel material in a FET-type device that employs Sb-based compound semiconductor materials to facilitate high electron and hole mobilities, high ON current (e.g., for digital applications) and high frequencies (e.g., for analog applications).

In another example embodiment of the present disclosure, a $In_xGa_{1-x}Sb$ pMOSFETs (p-type Metal-Oxide-Semiconductor Field-Effect Transistors) with subthreshold slope (SS) of 120 mV/decade, ION/IOFF>$10^4$ and Gm,max of 140/90 mS/mm ($L_G$=5 µm), is fabricated using a self-aligned gate-first process. $Al_2O_3$ deposited using atomic layer deposition (ALD) with mid bandgap $D_{it}$ of $3\times10^{11}$/$cm^2$ eV and strain engineering are employed to achieve a high-mobility $In_xGa_{1-x}Sb$ pMOSFET. These approaches can be implemented in CMOS technologies using compound semiconductor materials, such as for low-power devices.

In another example embodiment of the present disclosure, a surface cleaning approach involves removing native oxide on a Sb surface of a material used for or with a channel region, to form a stable surface that facilitates dielectric deposition. In certain more specific embodiments, an HCl-based clean is used to reduce both $GaO_x$ and $SbO_x$ formed on a GaSb surface, followed by dielectric deposition on the surface. This HCl-based clean provides a stable GaSb surface that is free or nearly free of native oxide.

In a further example embodiment of the present disclosure, a gate dielectric material used with a Sb-based channel region exhibits an interface state density of about $3 \times 10^{11}/cm^2$ eV. A self-aligned process flow is used for fabrication of these transistors. In some implementations, the temperature during the fabrication process of the transistors is held to be no higher than about 350° C. A thin layer is formed between the channel and the dielectric, and reduces the tunneling current due to band-to-band leakage (e.g., relative to the device without the thin layer). In some implementations, strain is introduced to the channel region using one or both of lattice mismatching between layers or the application of uniaxial stress.

In accordance with various example embodiments, a semiconductor apparatus includes a channel region, a dielectric, barrier layers separated by the channel region, and a gate electrode that applies an electric field to the channel region via the dielectric. One of the barrier layers is between the dielectric and the channel region, the respective barrier layers having band gaps that are different than a band gap of the channel region and act to confine both electrons and holes in the channel region (e.g., for both pmos and nmos applications). In some instances, the channel and barrier layers pass electron carriers for an n-type channel semiconductor device and hole carriers for a p-type channel semiconductor device.

In some instances, the barrier layers have a crystalline lattice constant that nearly matches a crystalline lattice constant of the channel region, and may be between about 0.5% and 5.0% different than a crystalline lattice constant of the channel region to introduce strain therein. In other instances, at least one of the barrier layers is in direct contact with the channel region at an interface and has a crystalline lattice constant that is sufficiently different than a crystalline lattice constant of the channel region to induce strain in the channel region of at least 1.0%. In this context, a material having a lattice constant that is not sufficiently different would include a material having lattice constant that induces less than 1.0% strain.

In certain embodiments, the semiconductor apparatus also includes an interfacial layer between the dielectric and the second barrier layer. This interfacial layer can mitigate oxidation of the second layer, such as by mitigating the growth of oxidation on the second layer. In some implementations, the interfacial layer is configured to facilitate the removal of oxidation from the interfacial layer at a rate that is greater than a rate of removal of oxidation from the second layer (e.g., some barrier layers may not be amenable to the removal of oxidation). In certain implementations, the interfacial layer forms a quantum well with the dielectric and the second layer to increase the effective bandgap of the interfacial layer and reduce the amount of available charge between the dielectric and the second layer. This quantum well and/or other aspects related to the interfacial layer may be implemented to separate carriers in the channel from interface traps at an interface between the dielectric and the second layer. These and other aspects can be achieved, in various embodiments, using an interface layer having a thickness of about 5 nm or less.

The respective channel regions and barrier layers include one or more of a variety of materials. In some instances, the channel region includes a Sb-based material, such as an $In_xGa_{1-x}Sb$ material. In such instances, at least one of the barrier layers may include an $Al_yGa_{1-y}Sb$ material. Such materials may be implemented with a valance band offset between about 0.3 eV and 0.6 eV. Using these and other approaches as discussed above, a semiconductor device can switch between conductance states in response to a threshold voltage bias applied to the gate electrode, and exhibit a sub-threshold slope of approximately 60-120 mV/decade.

Other example embodiments are directed to methods for manufacturing devices and apparatuses as discussed herein. In one embodiment, a first barrier layer is formed (e.g., on a semiconductor material), a channel region is formed on the first barrier layer, and a second barrier layer is formed on the channel region. The barrier layers are formed having band gaps that are different than a band gap of the channel region, and confine both electrons and holes in the channel region, and having a crystalline lattice constant that is different than a crystalline lattice constant of the channel region. The materials exhibiting this lattice constant mismatch are used to introduce strain to the channel region. Optionally, oxides are removed from the second barrier layer, a dielectric is foamed on the second barrier layer, and an electrode is formed on the dielectric. In some implementations, an interfacial layer is formed on the second barrier layer, and used to mitigate or prevent oxide growth on the second barrier layer. In certain embodiments, the interfacial layer is formed with a thickness and composition to create a quantum well and magnify an effective bandgap of the interracial layer.

Turning now to the figures, FIG. 1A shows an insulated gate device/apparatus 100, in accordance with an example embodiment of the present invention. The device 100 includes a gate electrode 110 on a gate insulator 120, which is over a substrate including a top barrier layer 130, channel region 140 and bottom barrier 150. Optionally, the device includes source and drain regions 160 and 170 respectively, as shown. In certain implementations, the top barrier, channel and bottom barrier layers as shown extend into the source and drain regions.

The barrier layers 130 and 150 both have a band gap that is different than the bandgap of the channel region 140. For example, with the channel 140 implemented with an Sb-based material having a bandgap that is less than the bandgap of the respective barrier layers 130 and 150, positive offsets can be obtained between conduction and valence band offsets (CBO/VBO) of the channel and barrier materials. In this context, when implemented as an n-channel transistor, a positive voltage applied to the gate 110 accumulates electrons in the channel. When implemented as a p-channel transistor, negative voltage applied to the gate 110 accumulates holes in the channel 140. Accordingly, various embodiments are directed to apparatuses with a CBO/VBO of greater than 50 meV with respect to narrow and wide band gaps for the channel and barrier layers.

Figure 1B:
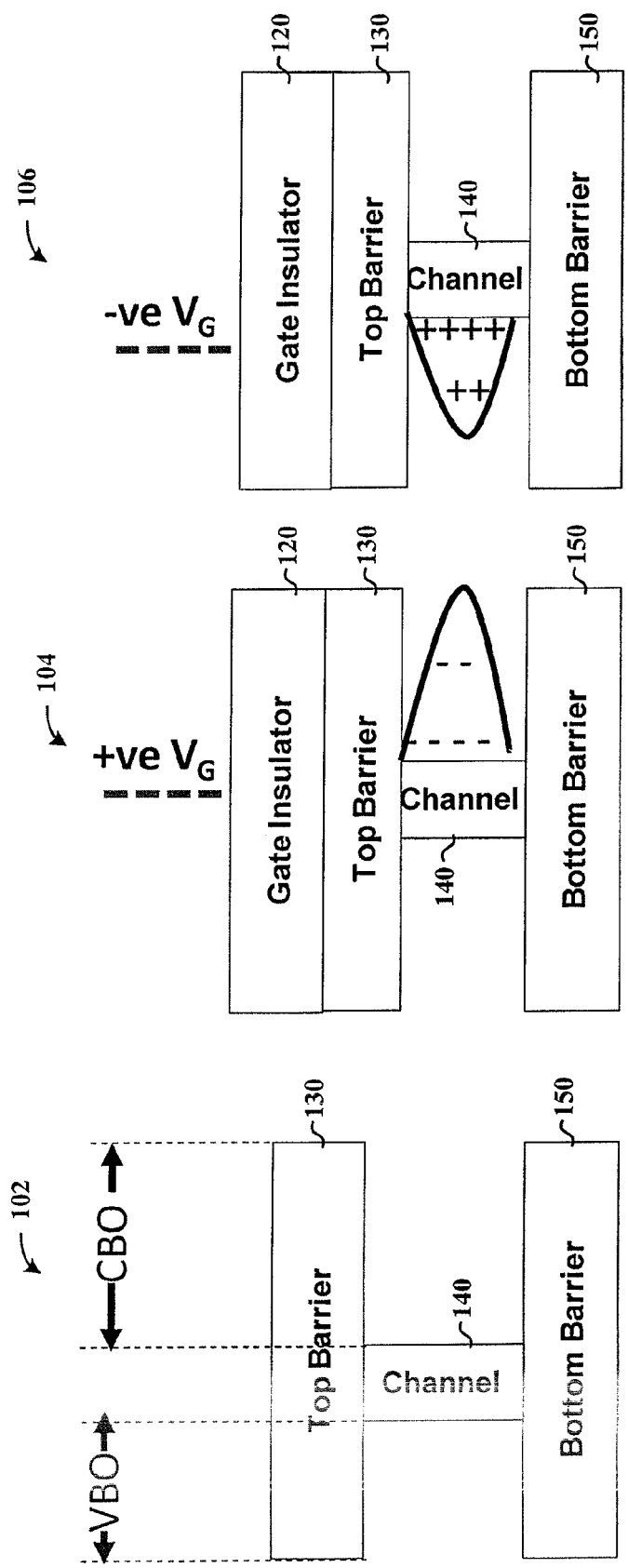
FIG. 1B shows band diagrams as may be implemented with the device shown in FIG. 1A, in accordance with other example embodiments of the present invention.

Referring to FIG. 1B, band diagram 102 shows top and bottom barrier layers with a channel therebetween, as corresponding to the barrier layers 130 and 150 as well as the channel 140, with CBO and VBO as shown to confine both electrons and holes. In various applications, the device 100 can be implemented to provide a channel region in both nmos-based and pmos-based applications. Accordingly, band diagrams 104 and 106 respectively show applications for nmos (positive gate voltage $V_G$) and pmos (negative gate voltage $V_G$).

Various embodiments are accordingly directed to setting and/or implementing the respective channel and barrier layers 130, 140 and 150 with bandgap differences that facilitate a desirable conduction band offset and valence band offset to accumulate charge carriers (electrons or holes) in the channel appropriately. For instance, the conduction band offset can be set with a corresponding (lower) mobility of the barrier layers 130 and 150 relative to the channel 140 to ensure that accumulated electrons are confined in the (higher mobility) channel when a positive voltage is applied on the gate 110, and further to ensure that the electrons do not spill into the barrier layer(s) with lower mobility. Similarly, a valence band offset can be set to confine holes in the (high mobility) channel 140 and mitigate or prevent them from spilling over into the barrier layer(s) 130 and 150.

In some embodiments, the respective barrier layers 130 and 150 and the channel region 140 are nearly lattice matched, such as materials having similar lattice constants/ bond lengths, but with different bandgaps as discussed above. In one implementation, an InGaSb material is used for the channel region 140 and AlGaSb is used for the barrier layers 130 and 150. In another implementation, GaSb material is used with the channel region 140, and an AlAsSb material (e.g., with an AlSb/AlAs short-period superlattice) is used for the barrier layers 130 and 150.

While various example embodiments are characterized using certain materials, such as a GaAs substrate and certain channel and barrier layer materials, several other semiconductors with different lattice constants may be used, such as a $Si_xGe_{1-x}$ channel with $Si_yGe_{1-y}$ barrier, an $In_xGa_{1-x}As$ channel with an $In_yAl_{1-y}As/Ga_yAl_{1-y}As$ or InP barrier, a $Sn_xGe_{1-x}$ channel with a Ge barrier, and an InSb channel with an $In_xAl_{1-x}Sb$ barrier. In various such implementations, materials are selected based upon a similarity in lattice constants (having lattice structures that nearly match with an offset that induces desirable strain in the channel).

With these and other example materials, similarities in lattice constants between the two materials can be used to select and implement the materials, to achieve desirable conduction band and valence band offsets. In some implementations, the offsets are measured/detected using an approach such as low energy x-ray photoelectron spectroscopy (XPS) analysis. VBO is calculated by taking the difference between the valence band spectrum from the channel and barrier layers. The bandgaps for the channel layer and the barrier layer are extracted using photoluminescence (PL) measurements and used to calculate the conduction-band offset (CBO). For example, using $In_{0.20}Ga_{0.80}Sb$ as a channel material and AlGaSb as a barrier material, a bandgap of a 7 nm $In_{0.20}Ga_{0.80}Sb$ channel can be obtained at about 0.70 eV (and detected using PL measurements), with the CBO and VBO respectively at 0.32 eV and 0.30 eV. By setting a sufficient CBO and VBO, the heterostructure design can thus confine most or all of both electrons/holes (e.g., 80/90% of electron/ holes can be confined in a high mobility channel such as channel 140).

In some embodiments, the interface between the top barrier layer and the insulator 120 is passivated, which can be used to mitigate/address issues relating to the oxidation of surfaces upon exposure to atmosphere, and related issues such as the instability of such oxides and the related high density of interface traps. In one implementation, the semiconductor interface between the gate insulator 120 and the top barrier layer 130 is chemically cleaned to remove some or all of any native oxide on the surface of the top barrier layer 130. For example, different chemicals such as 9% HCl, 10% $NH_4OH$, and 2% HF can be used to clean the surface, such as within a glove box purged with pure argon and a clean time of 2-3 min. In some instances, a subsequent anneal is carried out in ultrahigh vacuum at 90° C., 200° C., 300° C. and 400° C., and with a photon energy of 200 eV. In connection with these approaches, it has been discovered that an HCl-based clean can be used to reduce both $GaO_x$ and $SbO_x$ on a surface, with greater reduction achieved relative to that achieved using HF and/or $NH_4OH$.

In some implementations, the materials and/or processes used in forming an insulated gate device such as shown in FIG. 1A are set to obtain a desirable interface state density ($D_{it}$). For example, $D_{it}$ distribution across the bandgap can be determined using a conductance method in the depletion region on n and p-type substrates. The temperature is varied from 300-80K and measurements are made on both n and p-type substrates to probe the $D_{it}$ distribution across the entire bandgap. The $D_{it}$ distribution is asymmetric with low $D_{it}$ near the valence band edge and an order of magnitude higher $D_{it}$ towards the conduction band. Low $D_{it}$ values near the valence band can be achieved for obtaining good pMOSFET application performance, while the high $D_{it}$ near the conduction band can be avoided for nMOSFET application performance.

Various other example embodiments are directed to addressing problems as may relate to the passivation of a semiconductor surface, or to those related to the above discussion. For example, the surface of an upper barrier layer such as layer 130 in FIG. 1A can be augmented with a further layer that is amenable to passivation. For example, a thin film can be added between the gate insulator 120 and the top barrier layer 130 to mitigate oxidation of the barrier layer, and the material of the film can be chosen to facilitate the removal of any oxidation thereupon (e.g., AlGaSb can be capped with 2 monolayers of GaSb (~0.6 nm) to facilitate the removal of oxidation from the GaSb, relative to AlGaSb). In this context, the amount or rate of oxidation removal from the interfacial layer is greater than that of the top barrier layer 130 under similar conditions.

Figure 2:
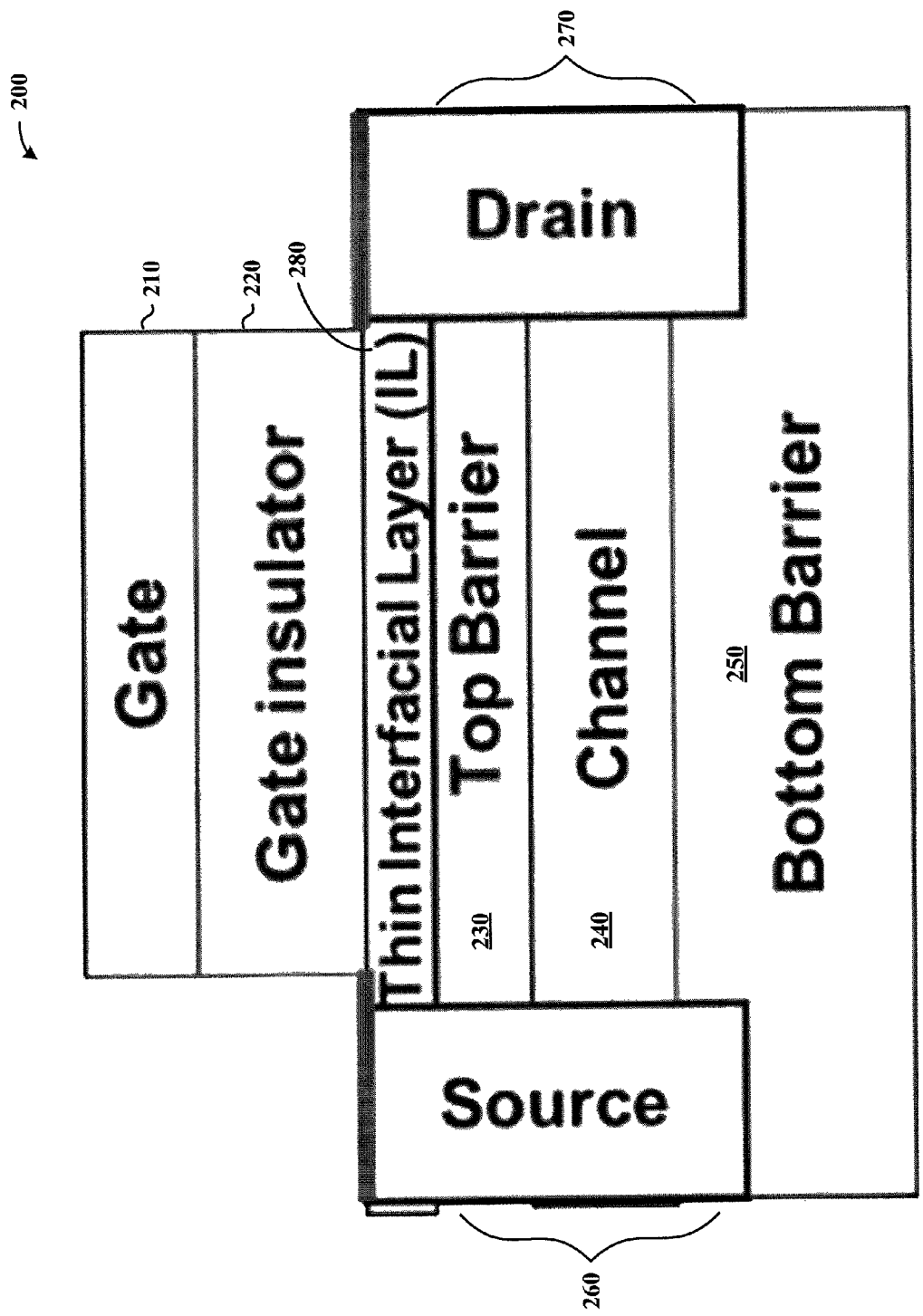
FIG. 2 shows an insulated gate device, in accordance with an example embodiment of the present invention.

FIG. 2 shows an insulated gate device/apparatus 200, in accordance with an example embodiment of the present invention. The device 200 is similar to the device 100 shown in FIG. 1A and thus uses similar reference numerals for a gate 210, gate insulator 220, top barrier layer 230, channel 240 and bottom barrier 250, also shown with source and drain 260 and 270 as may be implemented in a FET-type device. The device 200 also has an interfacial layer 280 between a gate insulator 220 and a top barrier layer 230, and having a bandgap that is smaller than the top barrier layer 230.

The interfacial layer 280 can be used to mitigate otherwise undesirable oxidation of the top barrier layer 230, and may exhibit oxidation behavior that renders the device amenable to cleaning/removal of oxidation otherwise difficult to achieve without the interfacial layer, such as described above. Various materials may be used for the interfacial layer 280 and in different configurations, and may be implemented in accordance with the approach shown in FIG. 2O. This interfacial layer 280 can be implemented to suppress any response from interface states (e.g., an available charge) at the upper surface of the top barrier layer 230. In this context, the interfacial layer 280 may be used to form a quantum well between the gate insulator 220, the interfacial layer 280 and the top barrier layer 230. As the thickness of interfacial layer 280 is decreased, quantization in the quantum well magnifies the effective of the bandgap ($E_{geff}$) of the interfacial layer, so less charge is available to respond to the interface-states in the range of transistor operation, with $E_{geff}$ increasing as the thickness of the interfacial layer is reduced, and approaching that of the top barrier layer 230 when the interfacial layer is only a few monolayers.

As a more particular example embodiment, an interfacial layer such as GaSb is formed on a top barrier layer material such as AlInSb, to form a quantum well between the gate insulator 220, the GaSb interfacial layer 280 and the top barrier layer 230. As the thickness of GaSb interfacial layer 280 is decreased, quantization in the AlInSb/GaSb/$Al_2O_3$ quantum well magnifies the effective of the bandgap ($E_{geff}$) of the GaSb layer, so less charge is available to respond to the interface-states in the range of transistor operation (e.g., with $E_{geff}$ calculated using a tight-binding (TB) method), with $E_{geff}$ increasing as the thickness of the GaSb layer is reduced, eventually approaching that of AlInSb when thickness of GaSb is below 6 monolayers.

The interfacial layer 280 can be manufactured using one or more of a variety of approaches. In one implementation, the layer 280 is formed of GaSb between an AlInSb barrier layer as the second layer 230, and an $Al_2O_3$ gate insulator as the dielectric 220. Two monolayers of GaSb are grown on an upper surface of the second layer 230, using molecular beam epitaxy. The monolayers are capped with about 50 nm of arsenic, to mitigate the oxidation of the monolayers due to exposure to the atmosphere. The arsenic capping is then removed under vacuum in an atomic layer deposition (ALD) chamber, prior to gate insulator deposition. The decapping of the arsenic can be observed by monitoring the pressure in the ALD chamber vs. temperature, by noting a spike in chamber pressure corresponding to decapping of the arsenic. For example, as the temperature of the chamber rises to about 400° C., a pressure spike that lasts 8-10 minutes before falling back to its original value can be used as an indicator of the arsenic decapping completion, after which the chamber temperature is reduced to 300° C. for ALD deposition. This arsenic protection step reduces the exposure of the Sb-surface to air and is used for obtaining good interface quality.

In connection with various embodiments, compressive and/or tensile strain is introduced in a channel region as discussed herein, by setting a lattice mismatch between material of the channel and material of barrier layers that are separated by the channel. For example, referring to FIG. 2, a lattice mismatch can be set between the top barrier layer 230 and the channel 240, and between the bottom barrier layer 250 and the channel 240, by using appropriate materials for the respective barrier layers and channel region. This mismatch is used to introduce strain to the channel and split the degeneracy between the light hole (1h) and heavy hole (hh) bands, which reduces interband scattering and can cause preferential population of holes in the band which has lighter in-plane mass, thereby enhancing hole mobility and improving hole transport. In some implementations, strain is introduced to control the populations of electrons in $\Gamma$ and L valleys of the channel 240 to facilitate electron transport.

Figure 3:
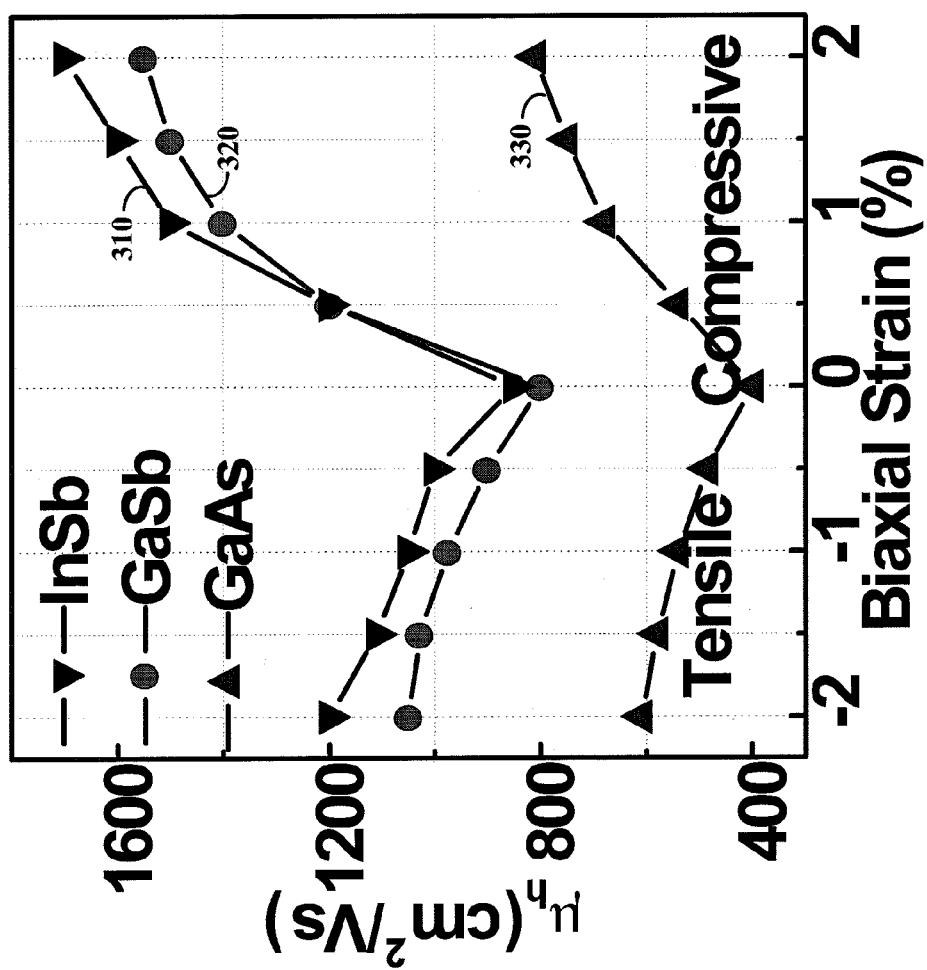
FIG. 3 shows hole mobility at different biaxial strain as may be implemented in accordance with one or more example embodiments of the present invention.

FIG. 3 shows plots of hole mobility at different biaxial strain as may be implemented with channel regions in accordance with one or more example embodiments of the present invention. The plots in FIG. 3 were formed using 8×8 k.p bandstructure calculations for hole mobility for several III-V semiconductors for varying levels of biaxial strain that can be introduced by setting the lattice mismatch between the channel and the buffer layers during the growth of these materials, as may be implemented in connection with one or more example embodiments. Plot 310 is for InSb, plot 320 is for GaSb and plot 330 is for GaAs. Some embodiments are directed to the application of about 1.0% or about 1.5% strain in the channel, and others are directed to the application of about 2% biaxial compressive strain in the channel (e.g., to facilitate an improvement in hole mobility of at least twice the mobility).

Figure 4:
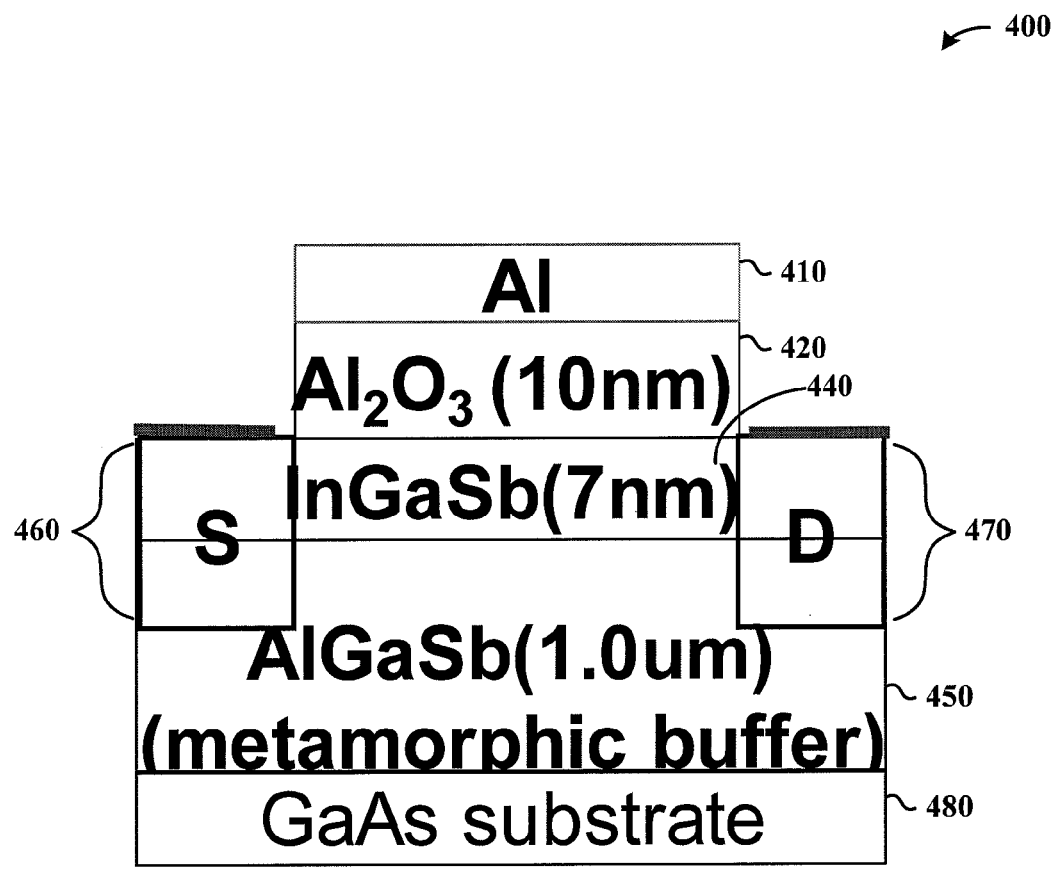
FIG. 4 shows an insulated gate device without a top barrier layer, in accordance with an example embodiment of the present invention.
Figure 5:
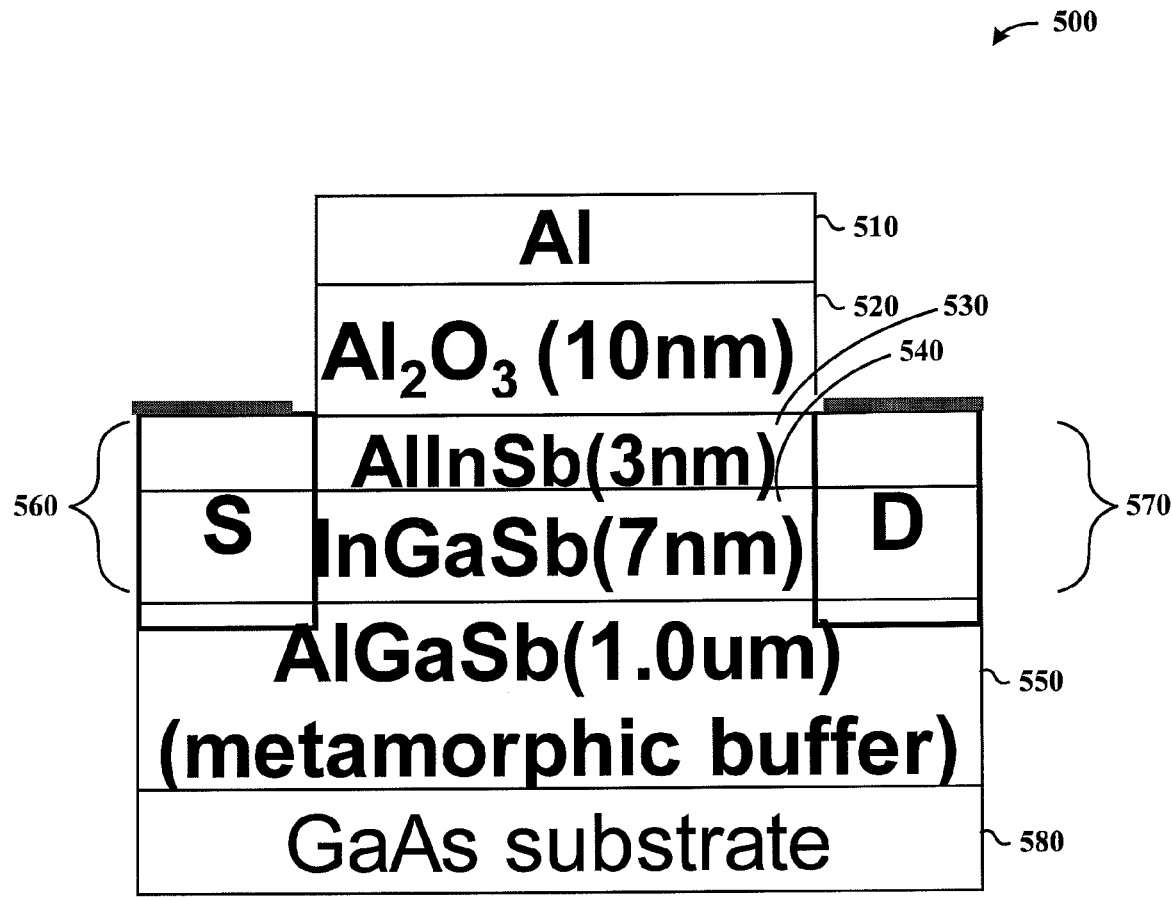
FIG. 5 shows an insulated gate device with a top barrier layer, in accordance with an example embodiment of the present invention.

FIGS. 4 and 5 respectively show insulated gate devices without and with a top barrier layer, in accordance with other example embodiments of the present invention. Beginning with FIG. 4, the device 400 includes an aluminum gate 410 on a 10 mm-thick $Al_2O_3$ dielectric layer 420 that is formed directly on an underlying 7 nm thick InGaSb channel 440. The channel is on 1 micrometer-thick AlGaSb barrier/buffer layer 450, which is in turn on an underlying GaAs substrate 480. Source and drain regions 460 and 470 are connected by the channel region 440. By way of example, the respective source and drain regions may include upper portions of InGaSb material of the channel region and lower portions of AlGaSb material of the barrier/buffer layer 450 as shown by lines through the respective source/drain regions.

Turning to FIG. 5, the device 500 is similar to the device in FIG. 4 as represented by similar reference numbers (e.g., barrier/buffer layer 550, on an underlying substrate 580, and channel layers 440 and 540 are both 7 nm thick and include InGaSb), with an added upper AlInSb barrier layer 530 between the $Al_2O_3$ dielectric layer 520 and the channel 540.

The devices 400 and 500 shown in FIGS. 4 and 5 may be manufactured using a variety of approaches. In one embodiment, p-channel transistors are fabricated using a self-aligned gate-first process flow as follows. An arsenic layer deposited to mitigate oxidation (e.g., on InGaSb layer 440 in FIG. 4 or on an AlInSb layer 530 in FIG. 5) is decapped in a vacuum-type environment as discussed above. About 100 cycles (e.g., 10 nm) of ALD $Al_2O_3$ is deposited at about 300° C. as the gate dielectric (420/520), followed by evaporation and patterning of the aluminum gate material (410/510). This is followed by ion implantation of beryllium, which acts as an acceptor in the antimonides (for creating p-type source/drain regions). The source and drain contacts (460/560 and 470/570) are formed by Ti/Ni deposition and liftoff. Fabrication of the transistors is completed with a 350° C. forming gas anneal, which also activates the source/drain implant. The temperature during the entire process is generally maintained below about 400° C., which facilitates a self-aligned gate-first process flow while preserving the high quality of the $Al_2O_3$/GaSb interface. In one implementation, this approach is used to form a p-channel HFET with a gate length of about 5 µm, an $I_{ON}/I_{OFF}$ greater than 4 orders of magnitude (e.g., $10^4$, for passing current between the source/drain regions), with gate current ($I_G$) and body leakage ($I_{SUB}$) orders of magnitude lower as compared to drain/source current ($I_D/I_S$) throughout the range of device operation, and a subthreshold slope (SS) of about 120 mV/decade.

Figure 6:
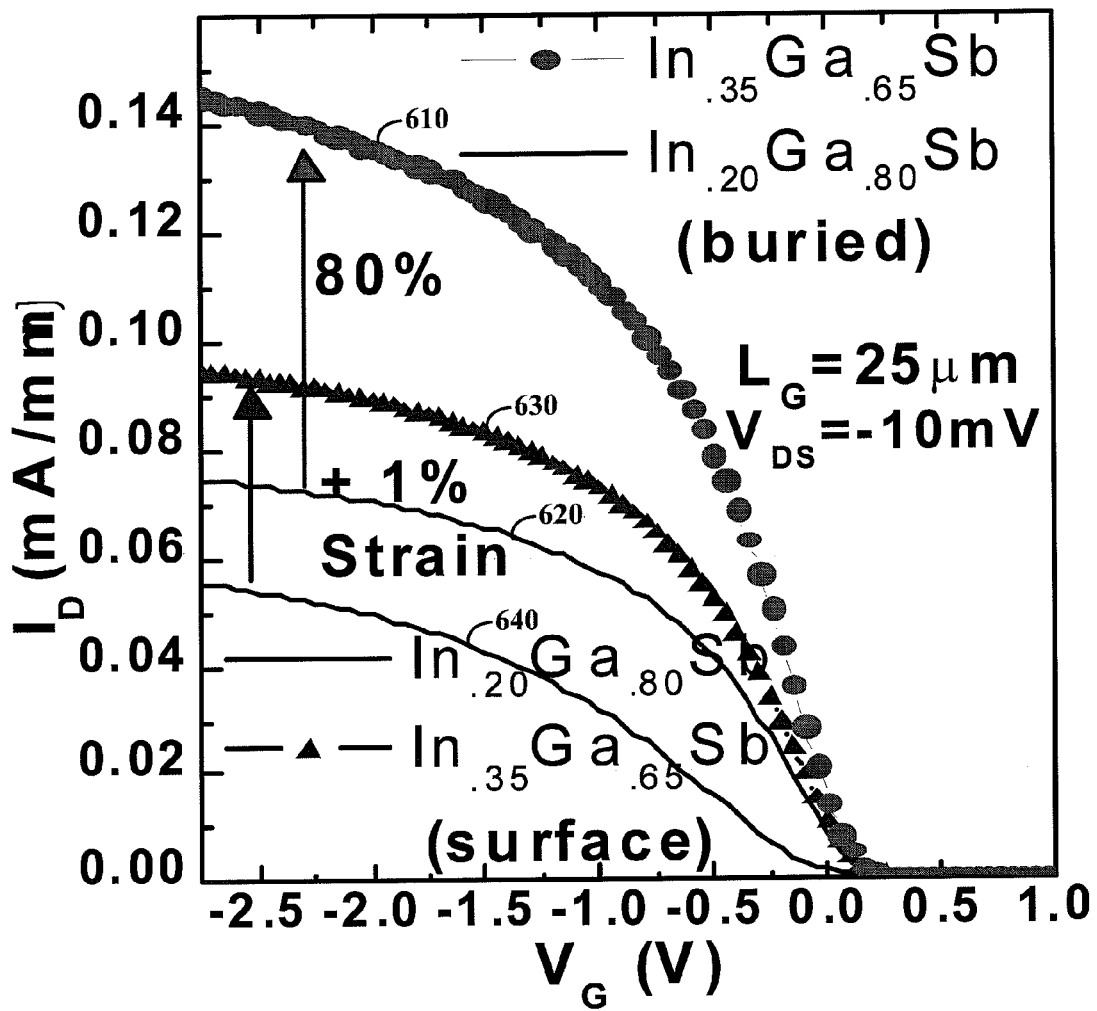
FIG. 6 shows current-voltage plots of insulated gate devices respectively having top and buried channel regions, under different biaxial compression, in accordance with other example embodiments of the present invention.

FIG. 6 shows current-voltage plots of insulated gate devices respectively having top and buried channel regions, under different biaxial compression, in accordance with other example embodiments of the present invention. The respective plots may, for example, be achieved with devices as shown in FIGS. 4 and 5. Plots 610 and 620 respectively show $I_D$-$V_G$ characteristics of an HFET with a buried InGaSb channel layer, such as shown in FIG. 5, respectively under different biaxial strains. Plots 630 and 640 respectively show $I_D$-$V_G$ characteristics of an HFET with surface InGaSb channel layer, such as shown in FIG. 4, respectively under different biaxial strains. A 30% increase in $I_{ON}$ is observed in the buried channel device as compared to the surface channel design. A further 80% increase is obtained with a 1% increase in compressive strain in the channel for both the surface and buried channel designs that is achieved by changing the indium content of the channel from 20% to 35%.

Figure 7:
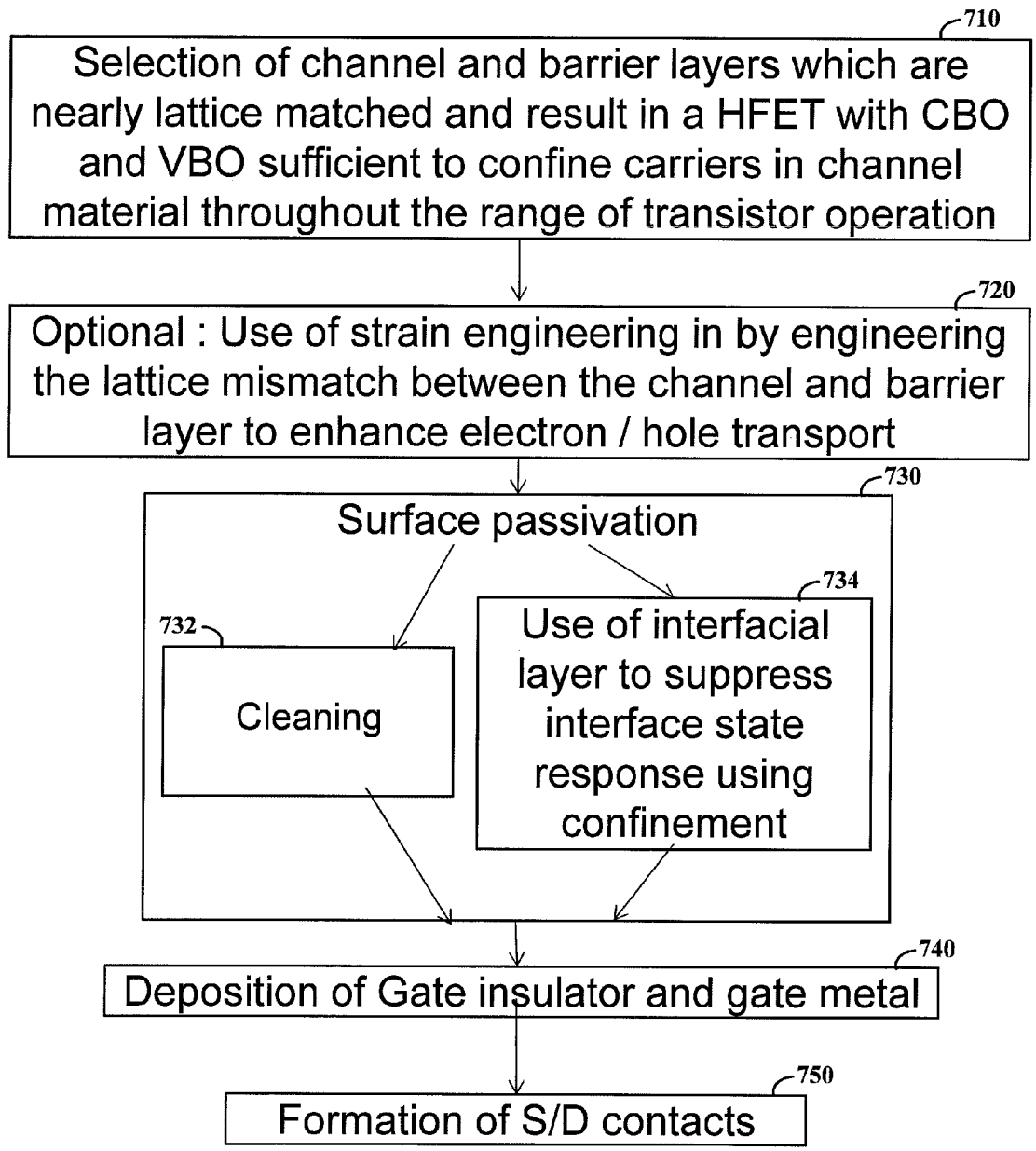
FIG. 7 shows a flow diagram for manufacturing an insulated-gate device, in accordance with an example embodiment of the present invention.

FIG. 7 shows a flow diagram for manufacturing an insulated-gate device, in accordance with an example embodiment of the present invention. At block 710, channel and barrier layers that are nearly lattice matched are selected, to achieve an HFET with conductance band offset (CBO) and valence band offset (VBO) characteristics that are sufficient to confine carriers in channel material throughout a design range of transistor operation. In some implementations, a strain amount is selected at block 720 for applying strain to the channel layer to enhance electron/hole transport properties (in some implementations, the step at block 720 is not used). At block 730, the surface of the HFET is passivated to facilitate the development of a high quality gate insulator for making the transistor. The surface passivation may include one or both of processing at block 732 for cleaning the surface, and the applicant of an interfacial layer to suppress interface state response using carrier confinement at block 734. At block 740, a gate insulator and gate electrode material are deposited, and source/drain contacts are formed at block 750.

Figure 8:
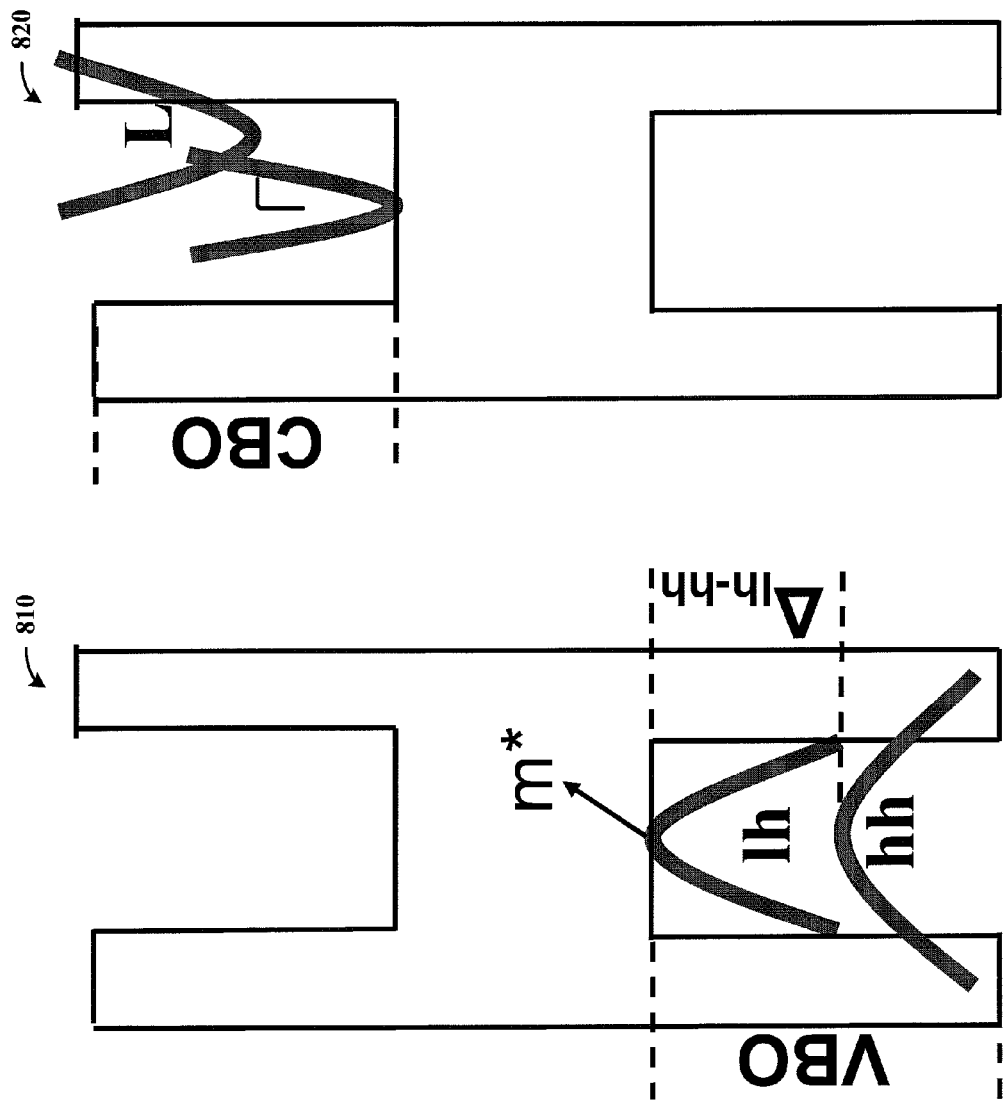
FIG. 8 represents an application of strain in a heterostructure, as may be implemented in accordance with one or more example embodiments.

FIG. 8 represents an application of strain in a heterostructure, as may be implemented in accordance with one or more example embodiments. For example, a lattice mismatch can be engineered between a channel and barrier layer to enhance the transport properties in the channel material. The presence of strain and confinement in the channel splits the degeneracy between the light and heavy hole bands as shown at 810, reducing the interband scattering and, in some instances, populating holes in a band that has lighter in-plane mass. The presence of strain can also be used to control the populations of electrons in the F and L valleys to facilitate electron transport, as shown at 820.

Experimental and/or Detailed Embodiments

The following discussion addresses various experimental and/or detailed embodiments. While many of these embodiments, as well as others discussed herein, are characterized using a GaAs type of substrate upon which a device is formed, such embodiments (or similar embodiments) may be implemented using Silicon substrate, or other substrates.

Figure 9:
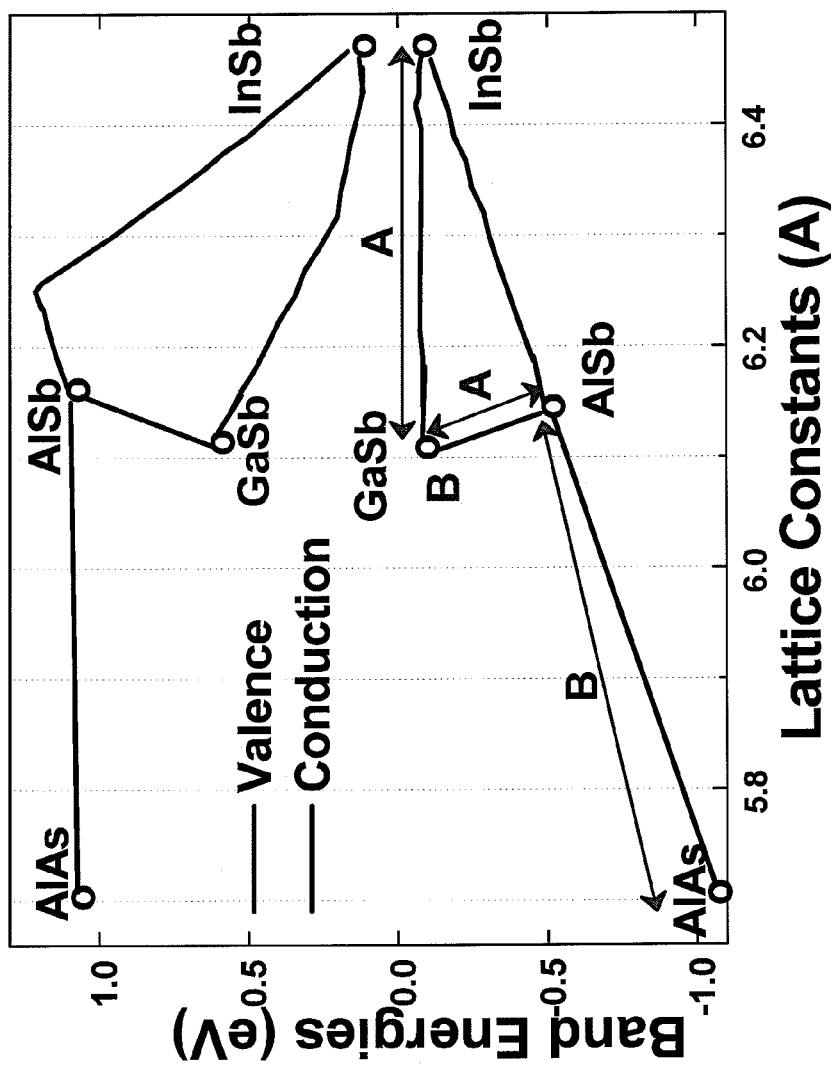
FIG. 9 shows plots of band energy versus lattice constants for different semiconductors, in accordance with another example embodiment of the present invention.

FIG. 9 shows plots of band energy versus lattice constants for different semiconductors in the lattice constant range of 5.8-6.4 Å, in accordance with another example embodiment. Two different approaches for obtaining an HFET design which can confine both electrons and holes in Sb-based channel material are shown and represented by plot sections A and B. Approach A uses an InGaSb channel and AlGaSb barrier layers, and Approach B uses a GaSb channel and AlAsSb barrier layers.

Figure 10:
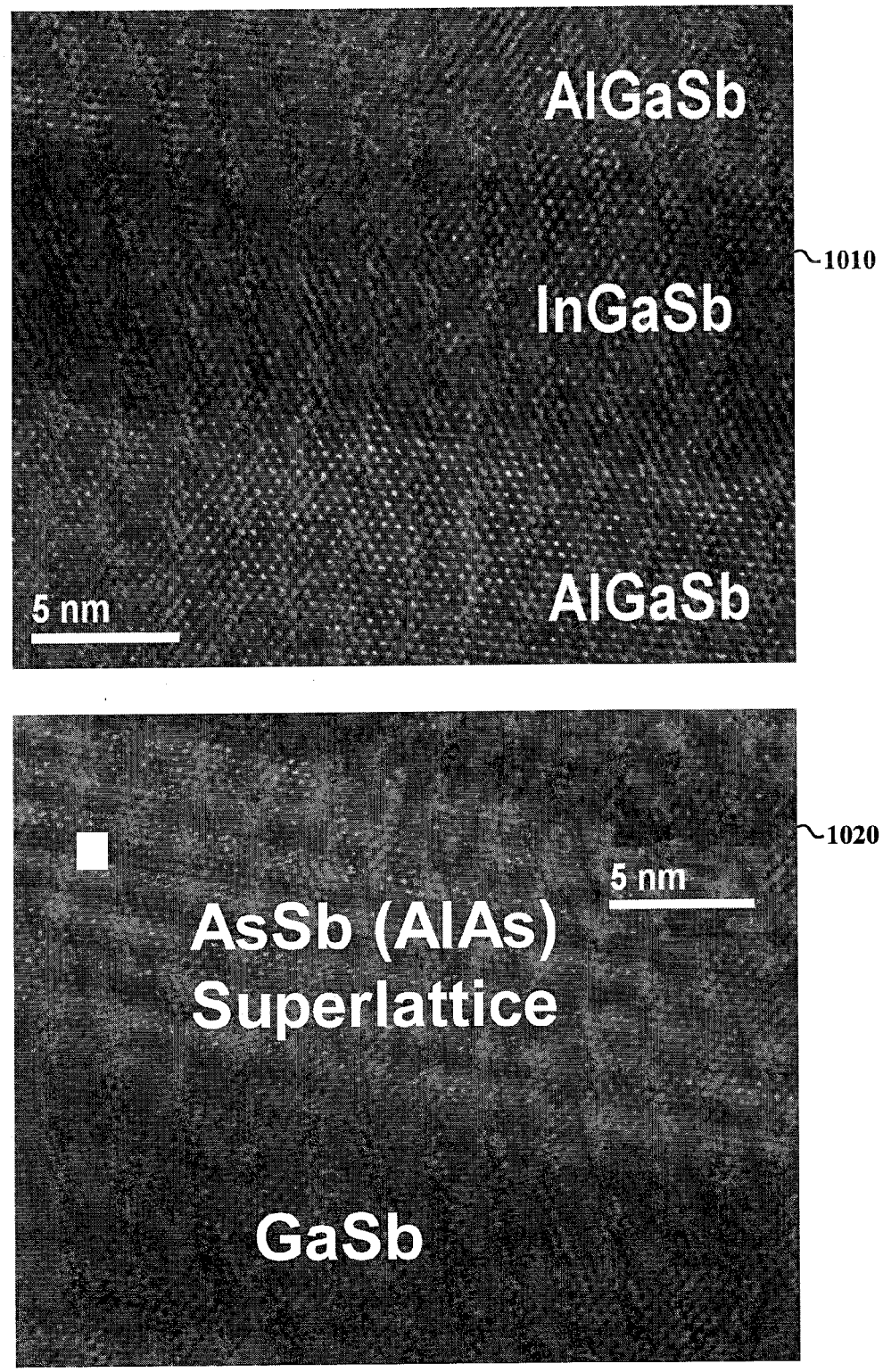
FIG. 10 shows cross-section transmission electron microscope images depicting channel and barrier layers for an HFET, in accordance with another example embodiment of the present invention.

FIG. 10 shows cross-section transmission electron microscope images depicting channel and barrier layers for an HFET design, with image 1010 corresponding to an $In_xGa_{1-x}Sb$ channel and image 1020 corresponding to a GaSb channel. The $AlAs_xSb_{1-x}$ layer includes AlSb/AlAs short-period superlattice.

Figure 11:
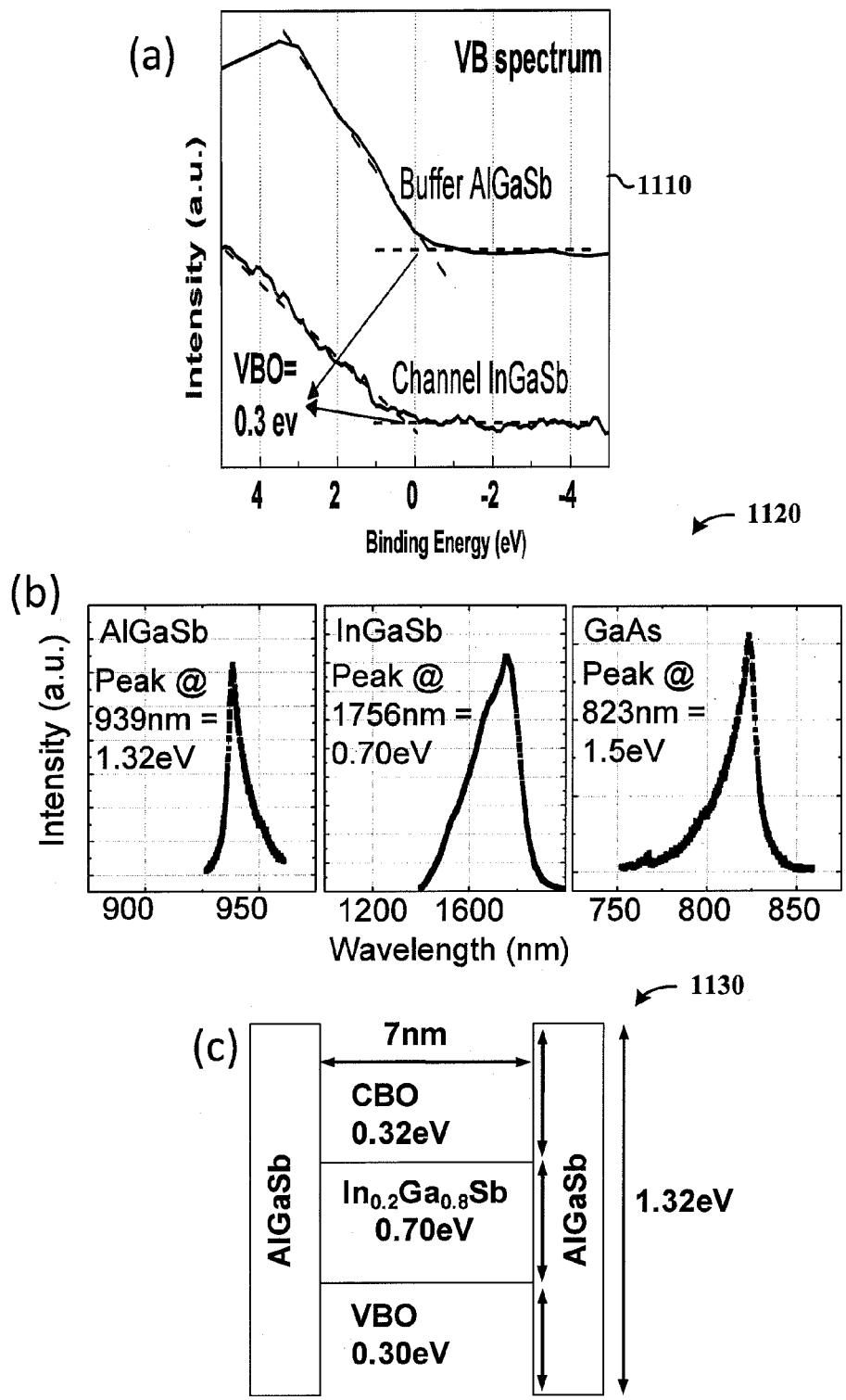
FIG. 11 shows valence band offset, bandgaps and a band diagram, in accordance with another example embodiment of the present invention.

FIG. 11 shows valence band offset, bandgaps and a band diagram in accordance with other example embodiments. At 1110, VBO is measured using low energy XPS by taking the difference between a valence band spectrum from a channel and a buffer. At 1120, plots for bandgaps of AlGaSb, InGaSb and GaAs are shown as measured using photoluminescence (PL) measurements. At 1130, a band diagram is shown for an InGaSb/AlGaSb structure that forms a heterostructure with sufficient CBO/VBO with the barrier layers to confine both electrons and holes in the InGaSb channel.

Figure 12:
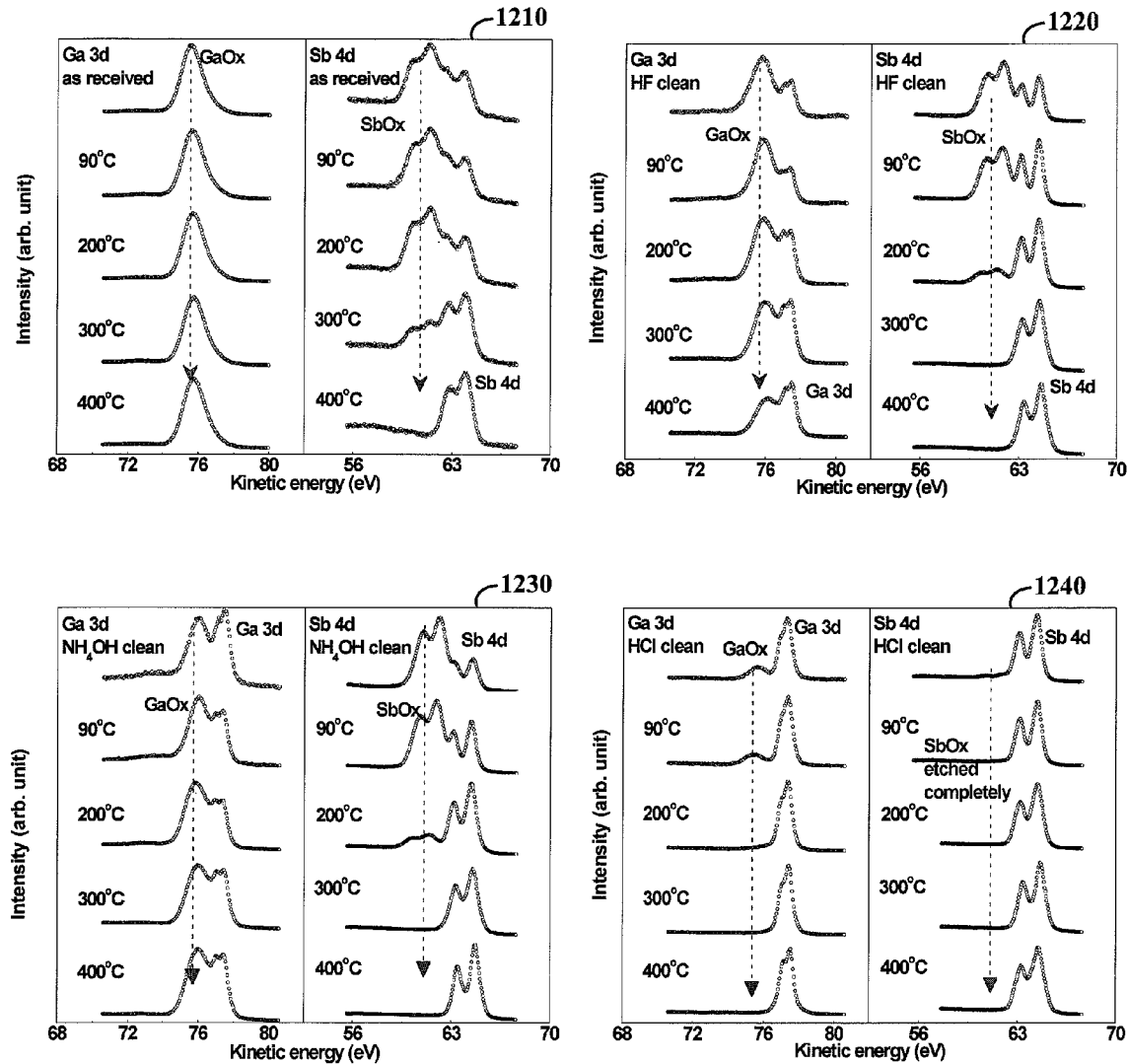
FIG. 12 shows synchrotron radiation showing the effect of chemical cleaning and thermal annealing, in accordance with another example embodiment of the present invention.

FIG. 12 shows synchrotron radiation with a photon energy of 200 eV, showing the effect of thermal annealing on an as-received sample at 1210, and after chemical clean in HF (1220), NH$_4$OH (1230) and HCl (1240), with Ga 3d and Sb 4d spectra plotted for a GaSb surface.

Figure 13:
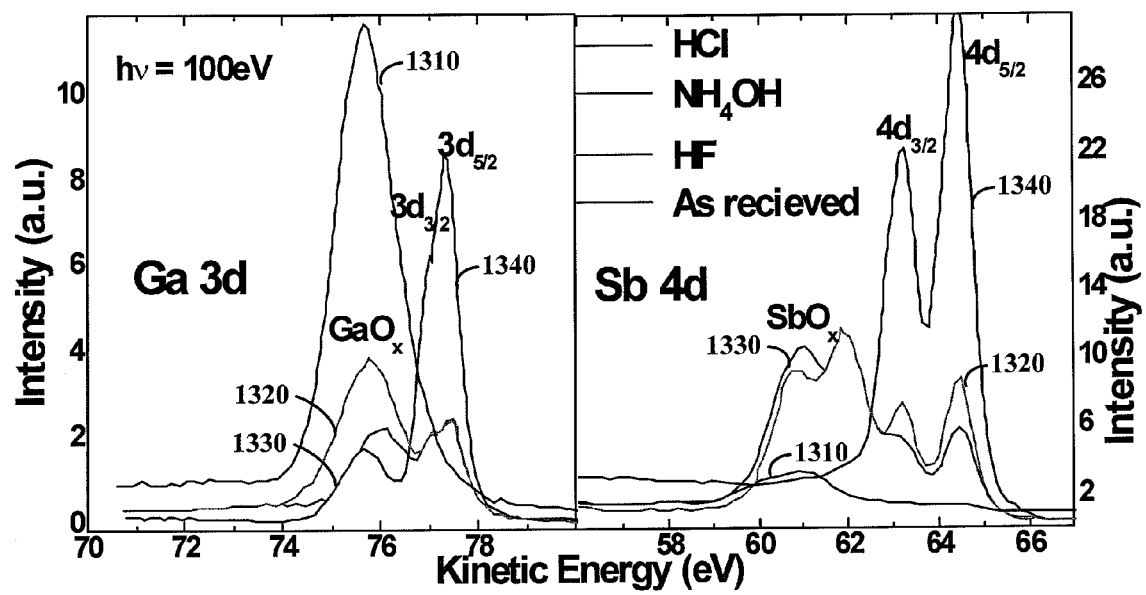
FIG. 13 shows synchrotron radiation, in accordance with another example embodiment of the present invention.

FIG. 13 shows synchrotron radiation with a photon energy of 100 eV, showing the effect of a top 2-3 monolayers of a GaSb interface (e.g., as described herein) on an as-received sample (1310) and after chemical clean in HF (1320), NH$_4$OH (1330) and HCl (1340).

Figure 14:
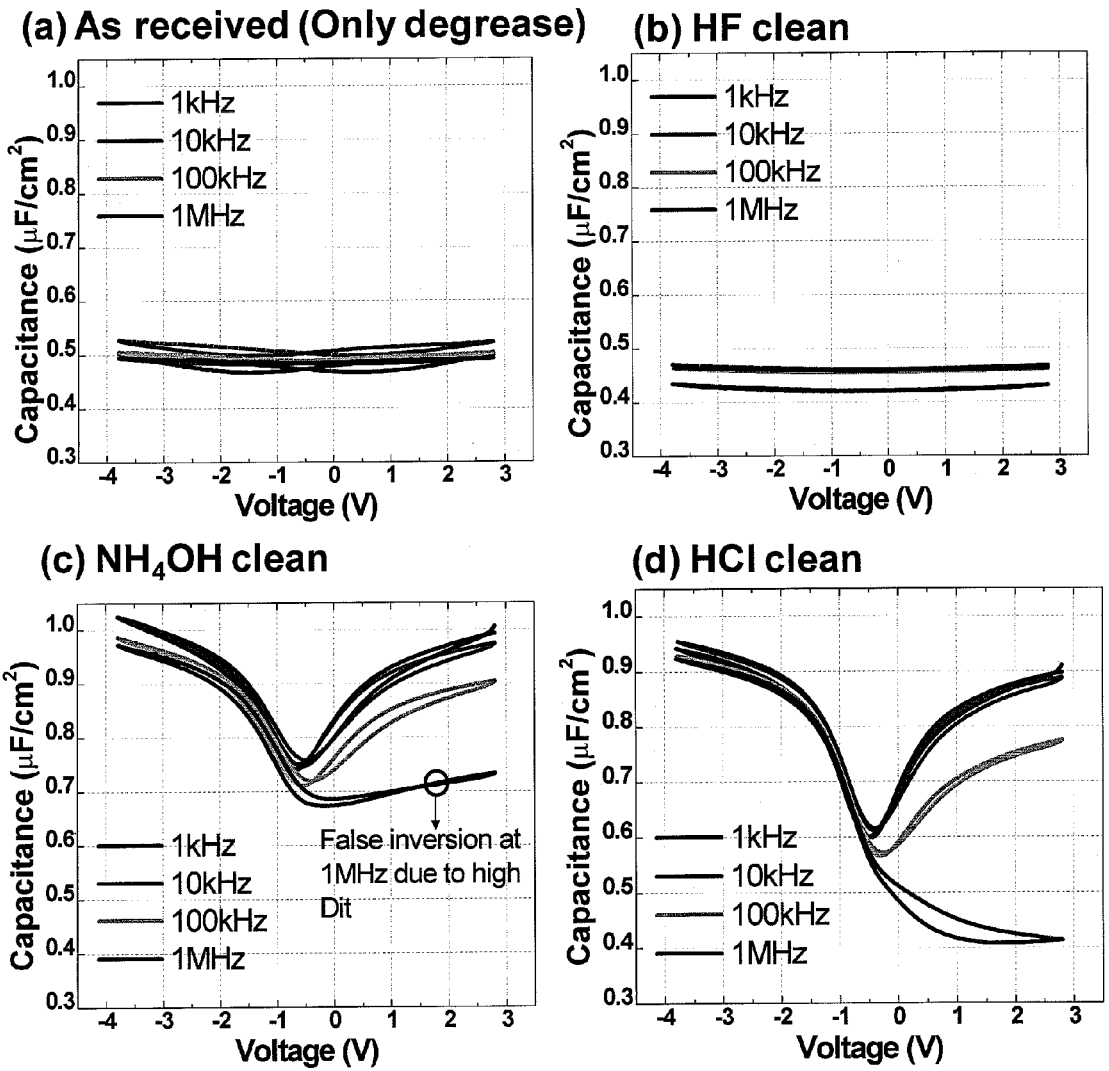
FIG. 14 shows bidirectional CV characteristics, in accordance with another example embodiment of the present invention.

FIG. 14 shows bidirectional CV characteristics plotted from 1 kHz to 1 MHz for GaSb capacitors for surfaces as received (a) and after (b) HF clean, (c) NH$_4$OH clean (d) HCl clean.

Figure 15:
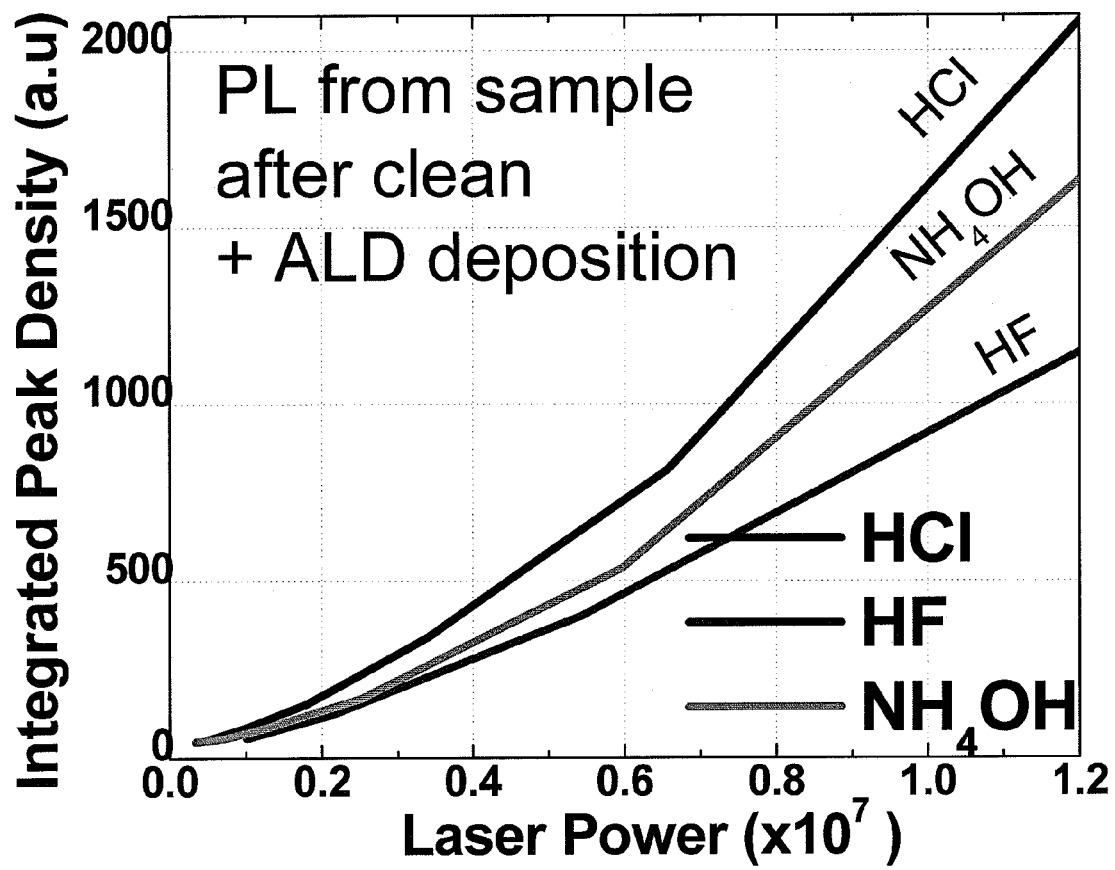
FIG. 15 shows integrated peak density of a photoluminescence (PL) signal plotted as function of laser power, in accordance with another example embodiment of the present invention.

FIG. 15 shows the integrated peak density of a photoluminescence (PL) signal plotted as function of laser power. Higher PL signal intensity is observed in a sample having undergone HCl clean, indicating better passivation.

Figure 16:
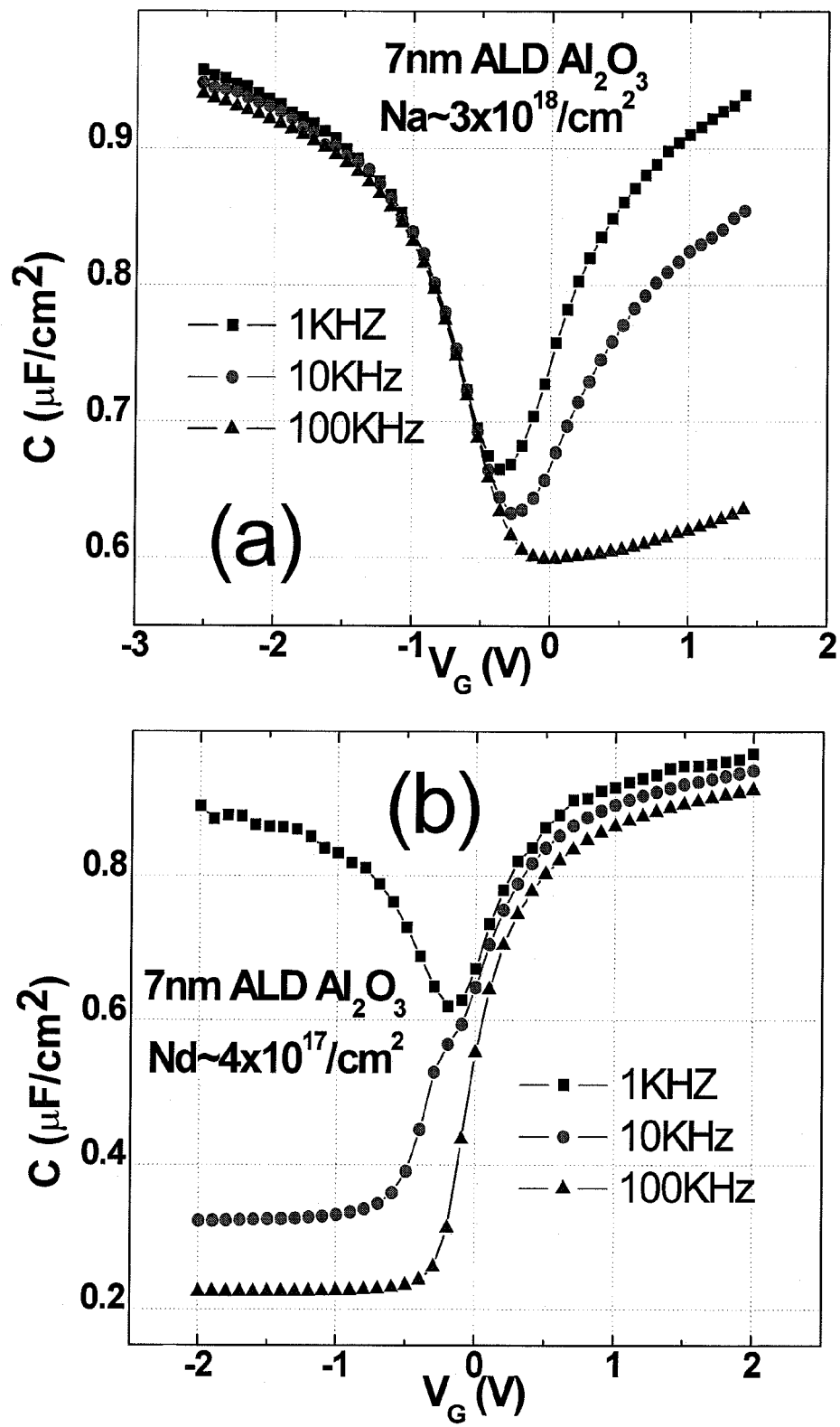
FIG. 16 shows measured CV characteristics at room temperature, in accordance with another example embodiment of the present invention.

FIG. 16 shows measured CV characteristics at room temperature over a frequency range of 1 kHz to 100 kHz on (a) p-type GaSb with Na~$3\times10^{18}$/cm$^2$ and (b) n-type GaSb with Nd~$4\times10^{17}$/cm$^2$.

Figure 17:
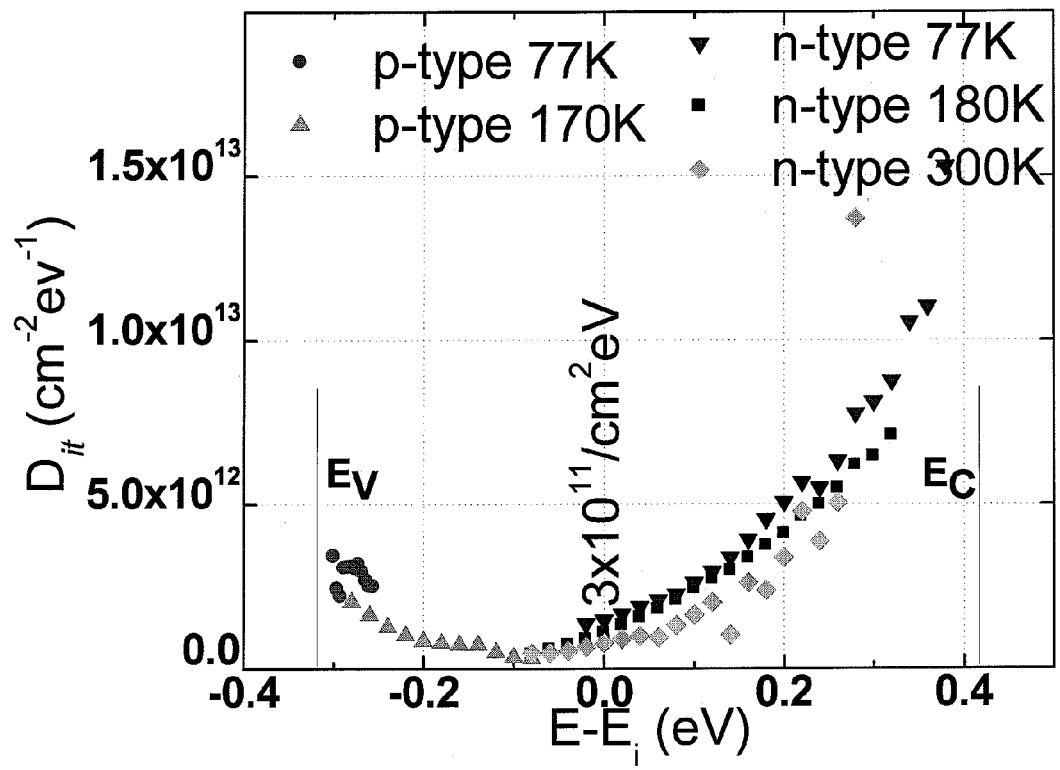
FIG. 17 shows $D_{it}$ distribution, in accordance with another example embodiment of the present invention.

FIG. 17 shows $D_{it}$ distribution calculated across the bandgap using a conductance method, utilizing both the p/n-type substrates and varying the measurement temperature from 300K to 77K.

Figure 18:
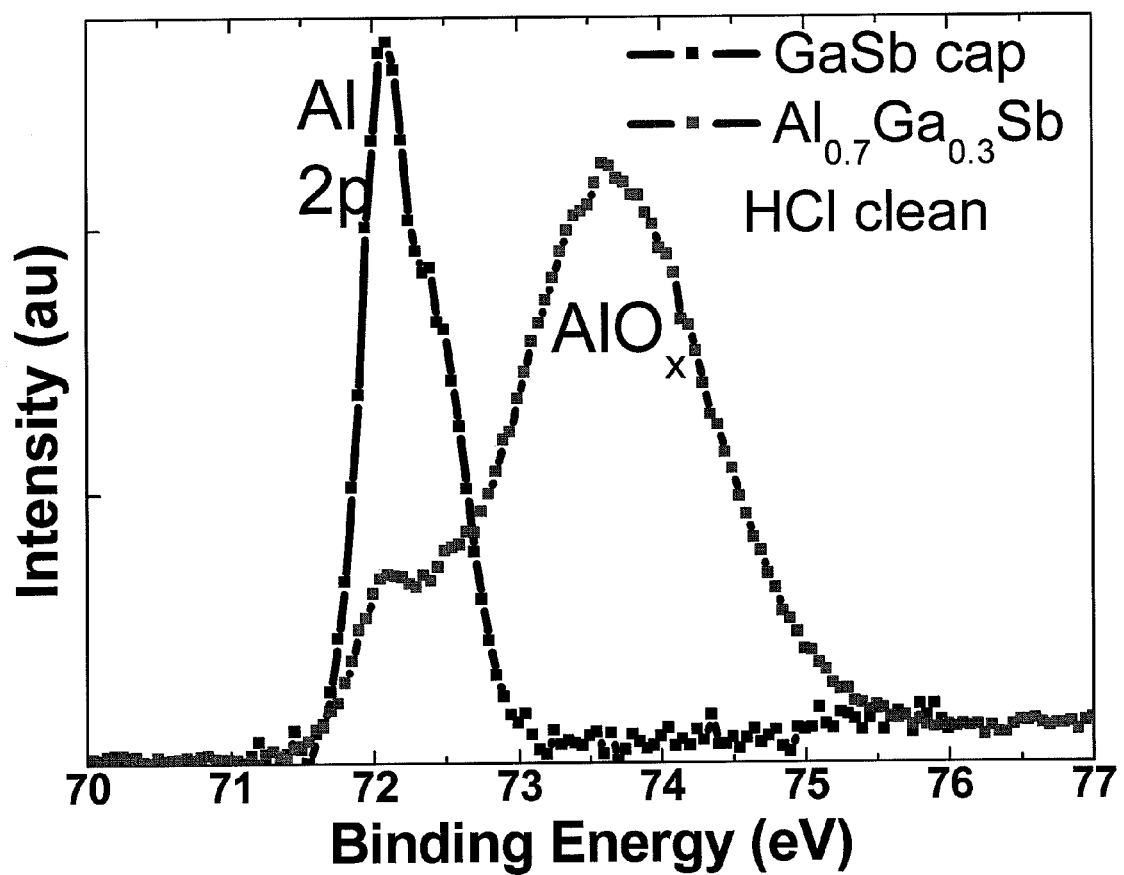
FIG. 18 shows an Al 2p spectrum after HCl acid clean, in accordance with another example embodiment of the present invention.

FIG. 18 shows an Al 2p spectrum after HCl acid clean for a sample having a surface terminated with $Al_{0.70}Ga_{0.30}Sb$ and a sample having two monolayers of GaSb cap on top of $Al_{0.70}Ga_{0.30}Sb$.

Figure 19:
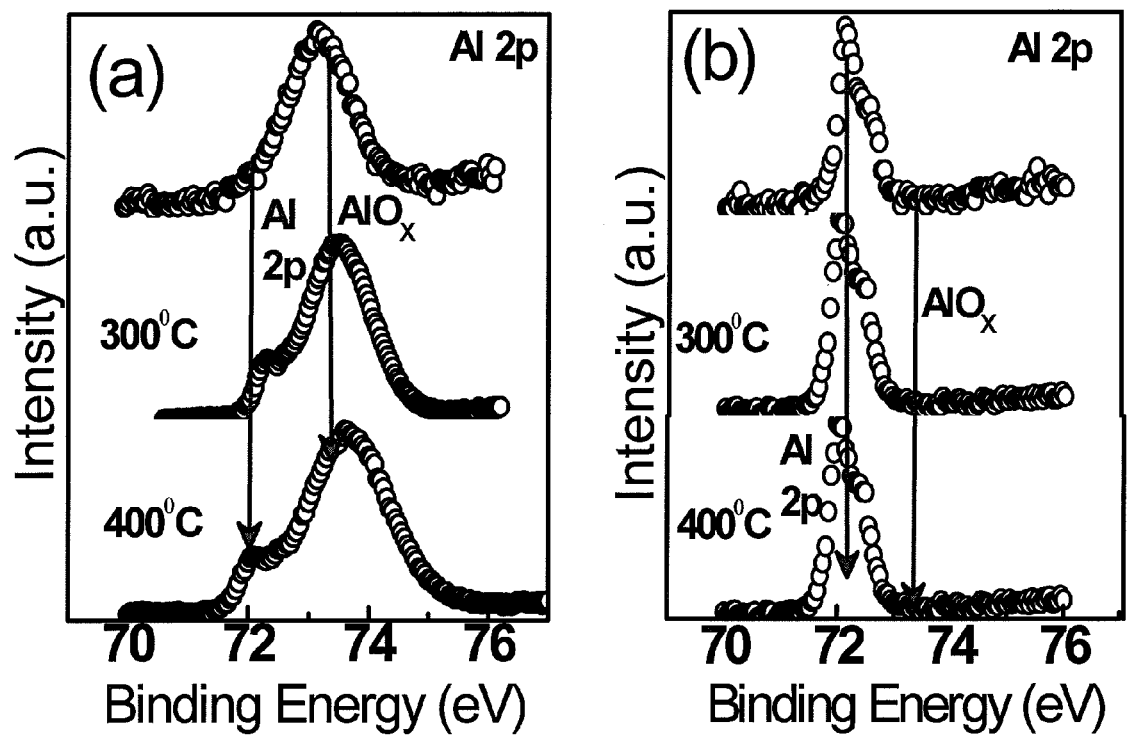
FIG. 19 shows an effect of annealing after HCl clean, in accordance with another example embodiment of the present invention.

FIG. 19 shows and effect of annealing after HCl clean on (a) $Al_{0.7}Ga_{0.3}Sb$ and (b) GaSb capped $Al_{0.7}Ga_{0.3}Sb$. The $AlO_x$ is not desorbed with thermal anneal for the $Al_{0.7}Ga_{0.3}Sb$ sample (a); while the Al is not oxidized for the sample with GaSb cap (b).

Figure 20:
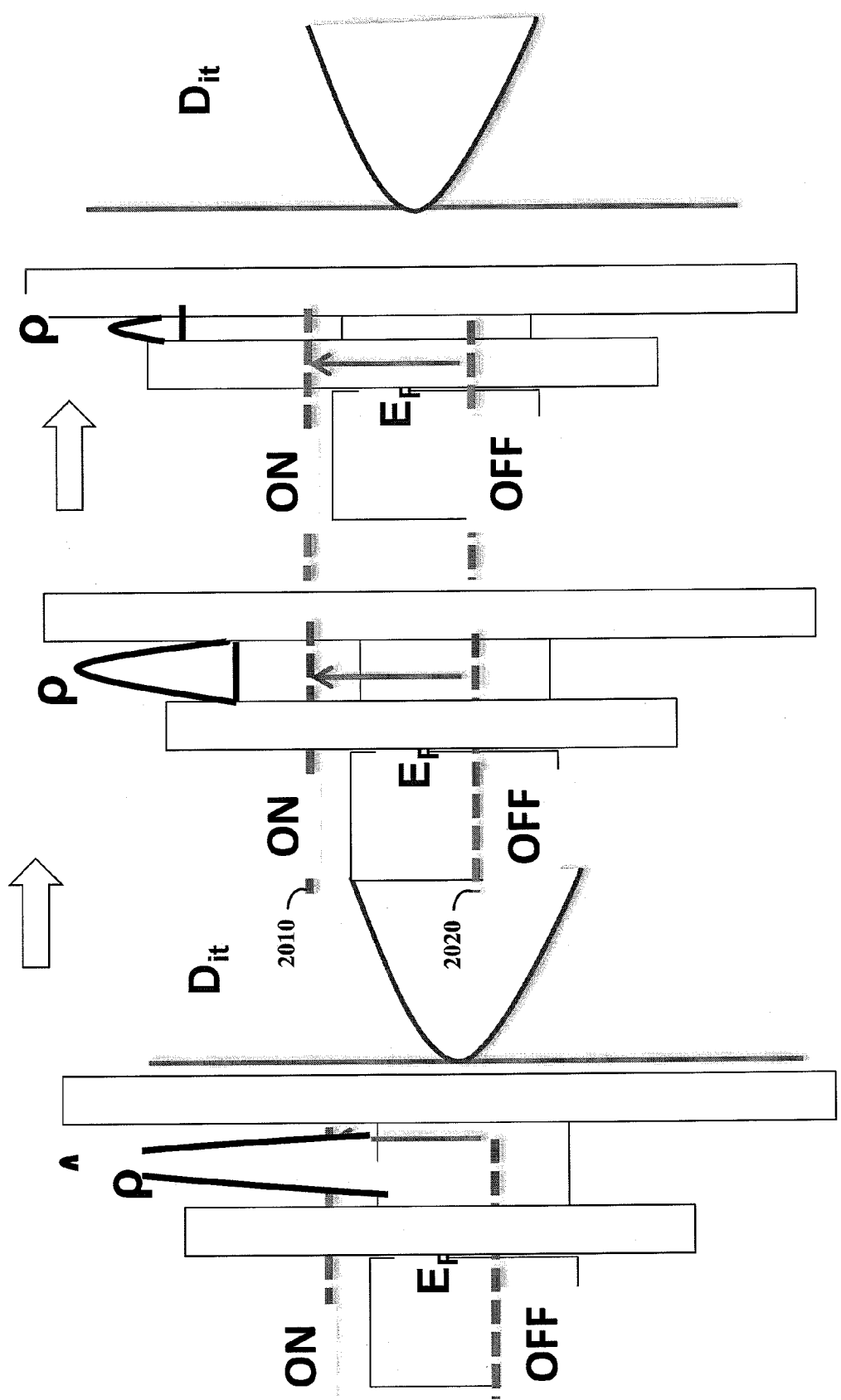
FIG. 20 shows respective applications of an interfacial layer at different thicknesses, in accordance with another example embodiment of the present invention.

FIG. 20 shows respective applications of an interfacial layer at different thicknesses, in accordance with various example embodiments. By inserting the thin interfacial later (such as GaSb) between a gate insulator and a barrier material (such as AlInSb), as discussed herein, response from the interface states can be suppressed in the range of Fermi-level movement required for transistor operation, due to quantum confinement in the thin interfacial layer. As the thickness of interfacial layer is decreased, quantization in quantum well resulting between the dielectric-interfacial layer-top barrier layer (Al$_2$O$_3$/GaSb/AlInSb) magnifies the effective bandgap of the interfacial layer (GaSb) layer so that less charge is available to respond to the interface-states in the range of transistor operation. Horizontal lines 2010 (ON) and 2020 (OFF) represent a range of Fermi level movement when the transistor is turned from ON to OFF.

Figure 21:
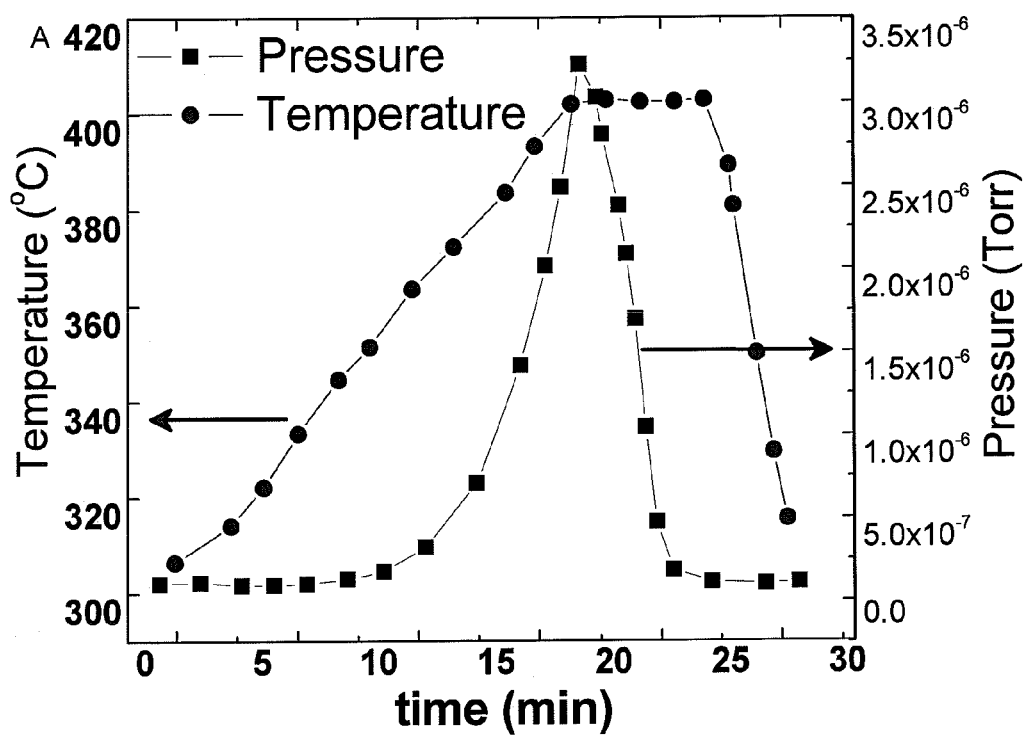
FIG. 21 shows a plot for the decapping of an arsenic layer used to mitigate or prevent the oxidation at a barrier layer surface, in accordance with another example embodiment of the present invention.
Figure 21:
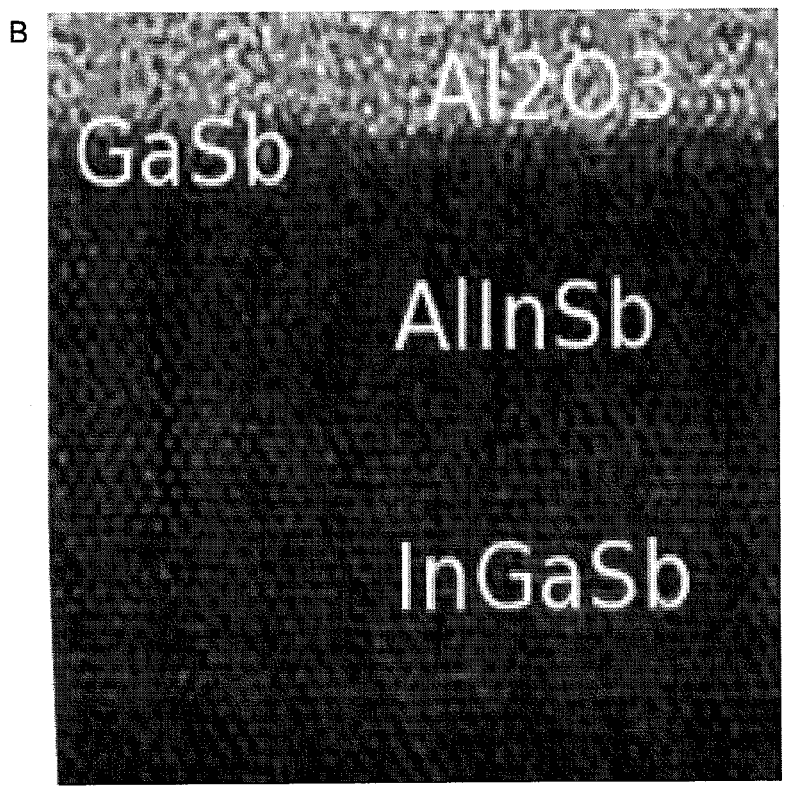

FIG. 21 shows a plot for the decapping of an arsenic layer used to mitigate or prevent the oxidation at a barrier layer surface, as detected via monitoring chamber pressure while raising temperature. The chamber temperature is reduced to 300° C. after the arsenic layer is decapped to start the ALD process. At (b), a high resolution TEM image shows an experimental implementation with two monolayers of GaSb between Al$_2$O$_3$ and wide-bandgap AlInSb barrier.

Figure 22:
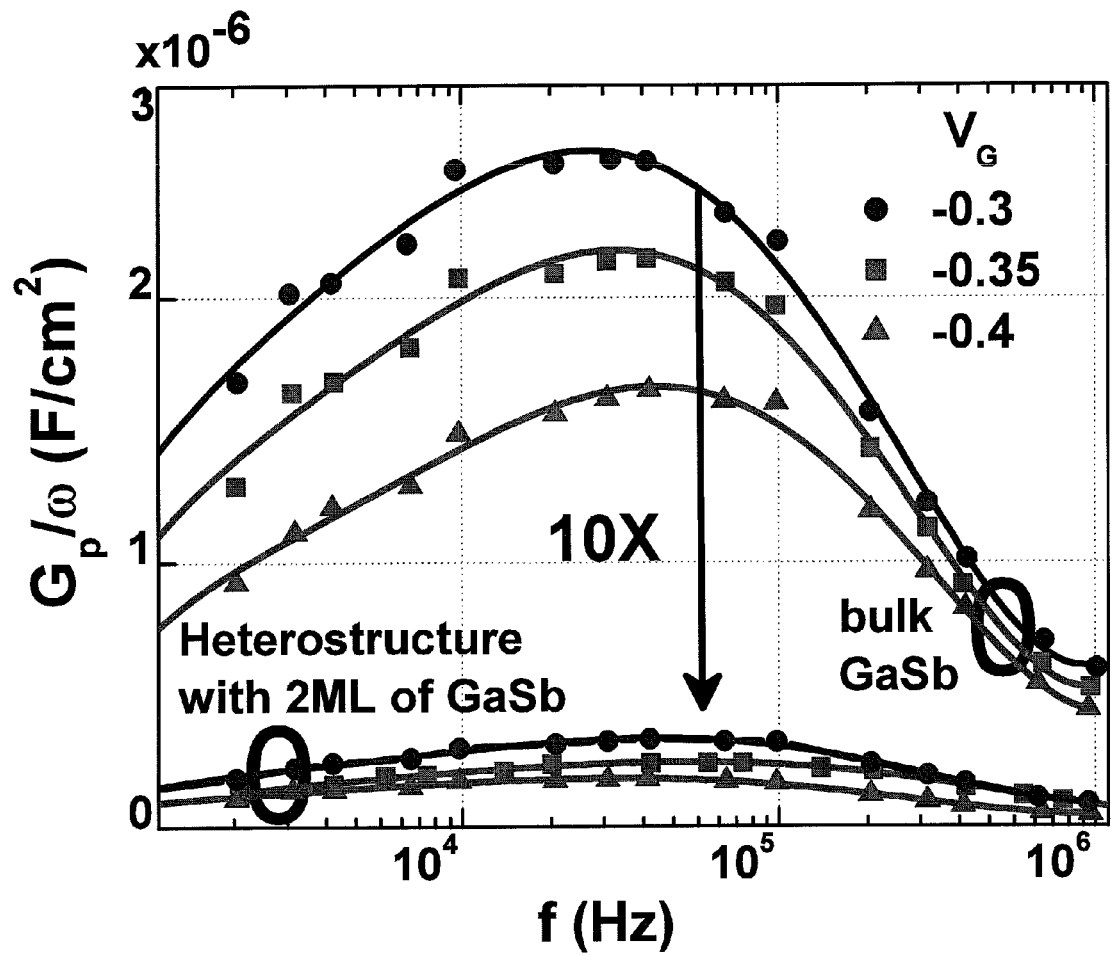
FIG. 22 shows a plot for a conductance method used to compare trap response on bulk GaSb vs. a heterostructure design terminated with two monolayers of GaSb, in accordance with another example embodiment of the present invention.

FIG. 22 shows a plot for a conductance method used to compare trap response on bulk GaSb vs. a heterostructure design terminated with two monolayers of GaSb. The $G_p/\omega$ data plot indicates an order of magnitude reduction in response from the interface states with the use of thin GaSb interfacial layer.

Figure 23:
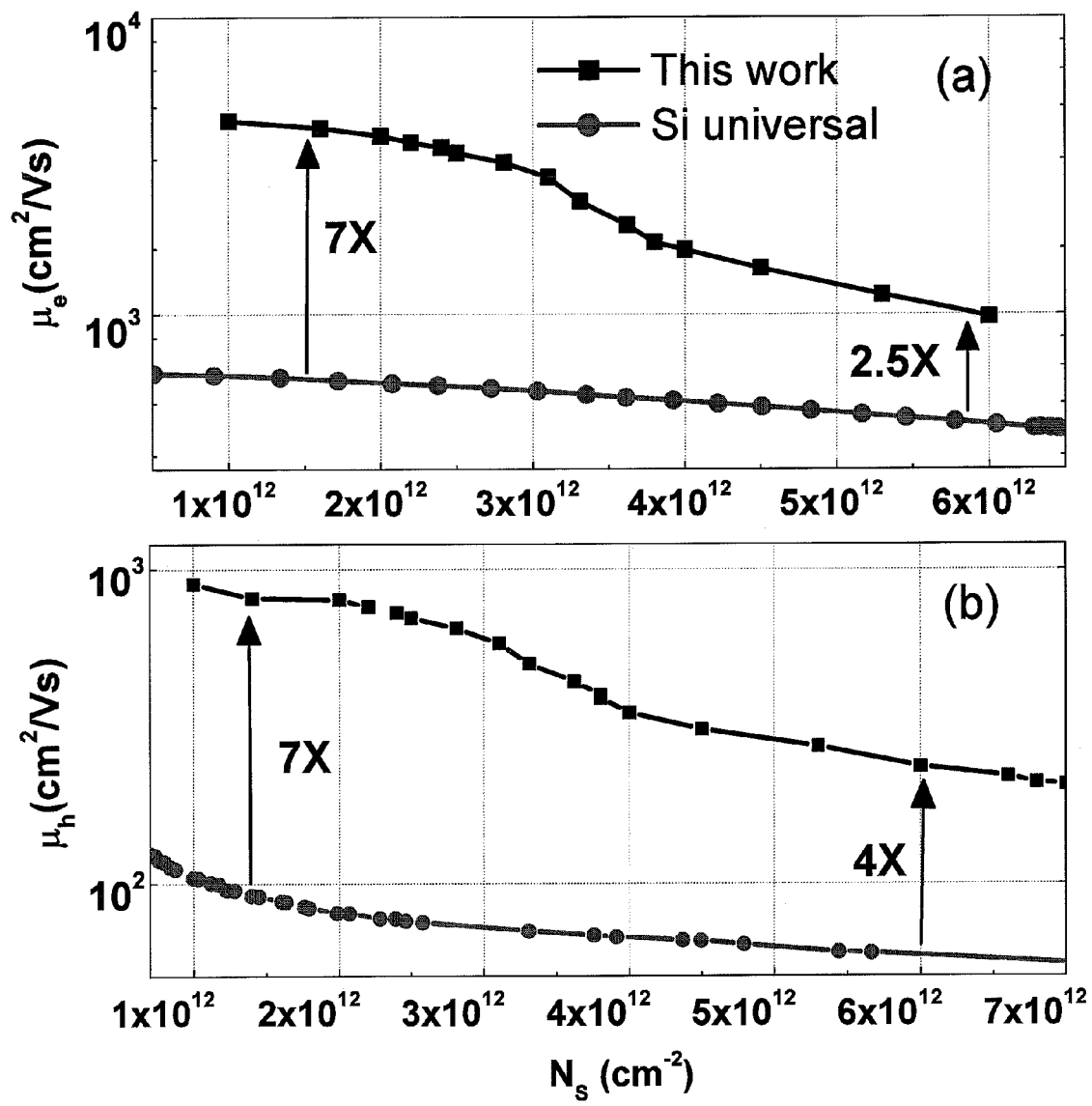
FIG. 23 shows electron and hole mobility measured in a $In_xGa_{1-x}Sb$ channel vs. sheet charge using gated Hall measurement, in accordance with another example embodiment of the present invention.

FIG. 23 shows (a) electron and (b) hole mobility measured in $In_xGa_{1-x}Sb$ channel vs. sheet charge (cm$^{-2}$) using gated Hall measurement. The electron/hole mobility is 7× higher as compared to universal silicon mobility at low sheet charge. Electron/hole mobility is more than 2.5×/4× as compared to Si universal mobilities even at high sheet charge.

Figure 24:
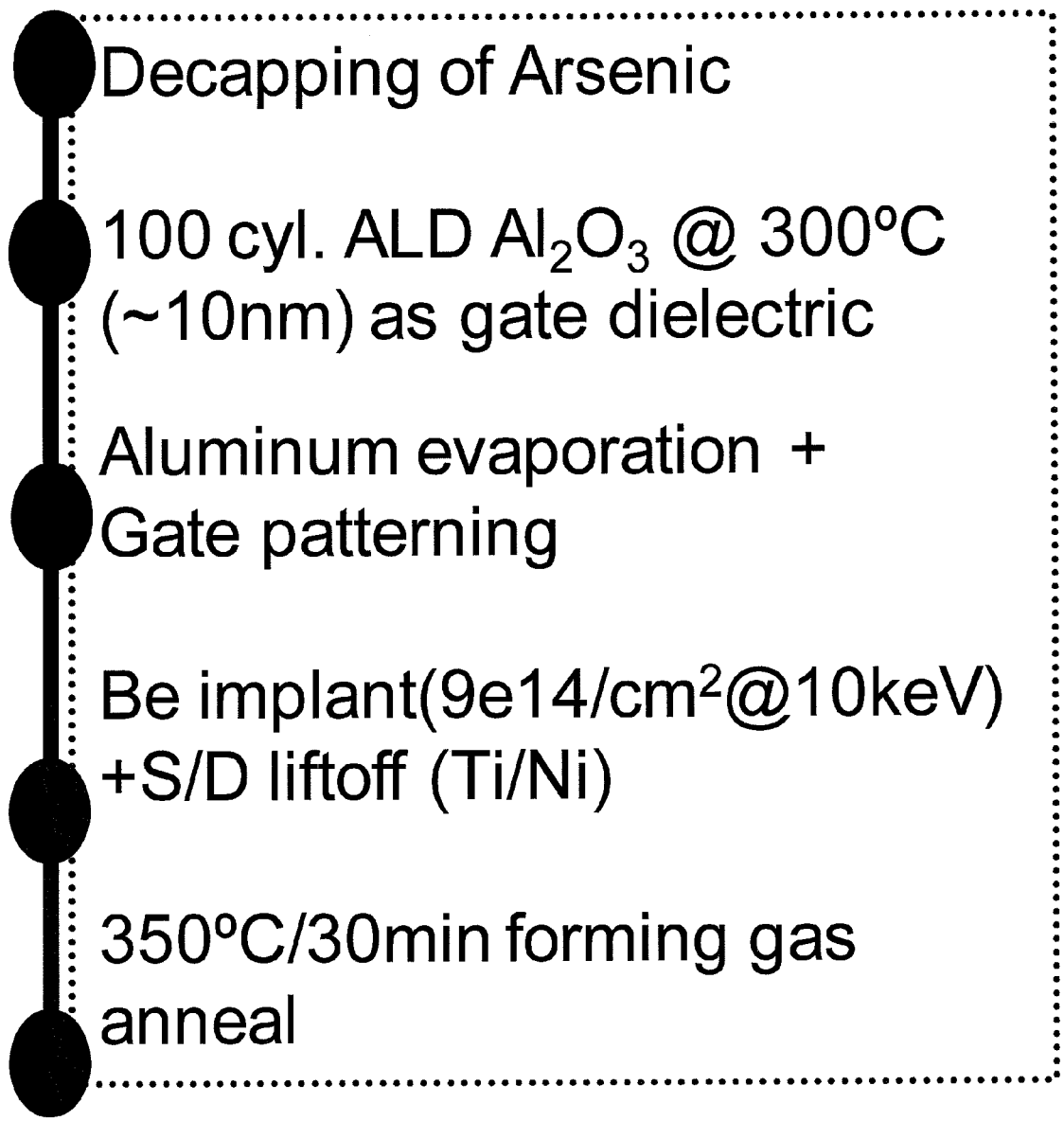
FIG. 24 shows a sample process flow for fabrication of an HFET device with an $In_xGa_{1-x}Sb$ channel, in accordance with another example embodiment of the present invention.

FIG. 24 shows a sample process flow for fabrication of HFET device with an $In_xGa_{1-x}Sb$ channel, in accordance with another example embodiment. Arsenic is decapped off of an upper barrier layer, followed by application of 100 cyl. ALD (atomic layer deposition) of Al$_2$O$_3$ at 300° C. for about 10 nm of gate dielectric. An aluminum gate is evaporated and patterned, followed by a Be implant (9e14/cm² at 10 KeV) plus a source/drain lift-off of Ti/Ni. An anneal is then carried out at 350° C. for 30 minutes.

Figure 25:
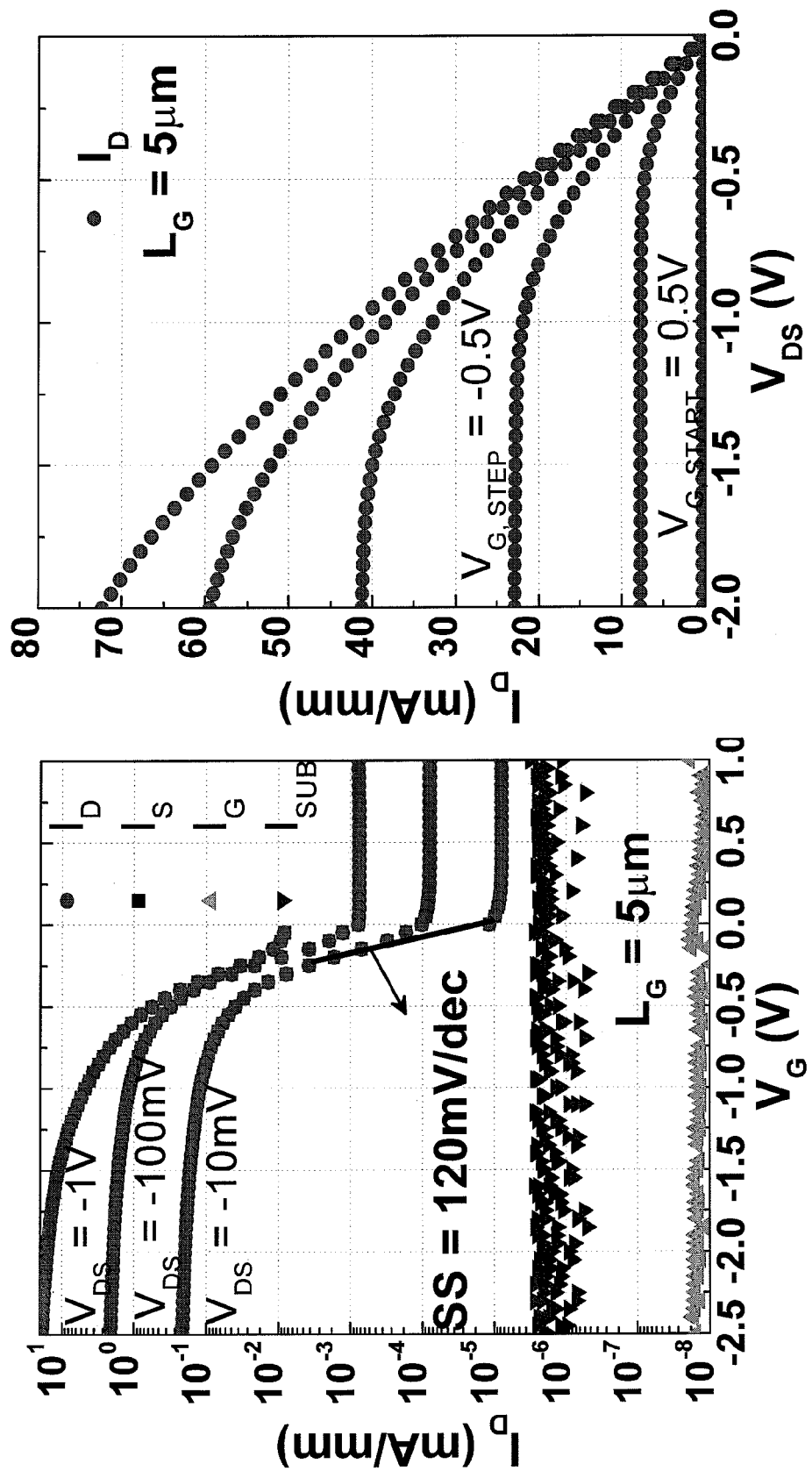
FIG. 25 shows output and transfer characteristics for an HFET device, in accordance with another example embodiment of the present invention.

FIG. 25 shows output (left) and transfer (right) characteristics for an HFET device with an $In_{0.35}Ga_{0.65}Sb$ channel and gate length ($L_G$) of 5 μm. The ratio of the ON/OFF current ($I_{ON}/I_{OFF}$) is >$10^4$ and the sub threshold swing (SS) is 120 mV/decade.

Various embodiments described above, and discussed in Appendices A-B as filed in the underlying provisional application may be implemented together and/or in other manners. One or more of the items depicted in the present disclosure and in the Appendices can also be implemented in a more separated or integrated manner, or removed and/or rendered as inoperable in certain cases, as is useful in accordance with particular applications. In addition, one or more example embodiments may be implemented in connection with one or more aspects as described in U.S. patent application Ser. No. 12/617,352 (U.S. Pat. No. 8,064,239) entitled "Memory Circuit with Quantum Well-type Carrier Storage" (e.g., for quantum well-type aspects), which is fully incorporated herein by reference. In view of the description herein, those skilled in the art will recognize that many changes may be made thereto without departing from the spirit and scope of the present invention.

What is claimed is:

1. A semiconductor apparatus comprising:
   a channel region;
   a dielectric;
   first and second barrier layers separated by the channel region, the second barrier layer being between the dielectric and the channel region, the first and second barrier layers respectively having band gaps that are different than a band gap of the channel region, and the channel region being configured and arranged therein to confine charge carriers in the channel region in response to an electric field, wherein the channel region is configured and arranged to confine electrons if the electric field corresponds to one of two opposing polarities and holes if the electric field corresponds to the other of the two opposing polarities; and
   a gate electrode configured and arranged to apply an electric field to the channel region via the dielectric.

2. The apparatus of claim 1, wherein the first and second barrier layers have a crystalline lattice constant that is different than a crystalline lattice constant of the channel region by an amount that induces at least 1% strain in the channel region.

3. The apparatus of claim 1, wherein the first and second barrier layers have a crystalline lattice constant that is between about 0.5% and 5.0% different than a crystalline lattice constant of the channel region.

4. The apparatus of claim 1, further including an interfacial layer between the dielectric and the second barrier layer and configured and arranged to mitigate oxidation between the dielectric and the second barrier layer.

5. The apparatus of claim 4, wherein the interfacial layer is configured and arranged to mitigate oxidation by mitigating growth of oxidation on the second barrier layer, and by facilitating removal of oxidation from the interfacial layer at a rate that is greater than a rate of removal of oxidation from the second barrier layer.

6. The apparatus of claim 4, wherein the interfacial layer is configured and arranged to form a quantum well with the dielectric and the second barrier layer to increase an effective bandgap of the interfacial layer and reduce the amount of available charge between the dielectric and the interfacial layer.

7. The apparatus of claim 4, wherein the interfacial layer and the first barrier layer are configured and arranged to separate carriers in the channel from interface traps at an interface with the dielectric.

8. The apparatus of claim 1, wherein at least one of the barrier layers is in direct contact with the channel region at an interface and has a crystalline lattice constant at the interface that is sufficiently different than a crystalline lattice constant of the channel region at the interface to induce strain in the channel region of at least 1.0%.

9. The apparatus of claim 1, wherein the channel region and the barrier layers are capable of passing, during inversion, electron carriers when configured for an n-type channel semiconductor device and hole carriers when configured for a p-type channel semiconductor device.

10. The apparatus of claim 1, wherein the channel region includes a Sb-based material.

11. The apparatus of claim 1, wherein the channel region includes a $In_xGa_{1-x}Sb$ material and at least one of the barrier layers includes an $Al_yGa_{1-y}Sb$ material.

12. The apparatus of claim 1, wherein the channel region includes a $In_xGa_{1-x}Sb$ material and the first and second barrier layers include an $Al_yGa_{1-y}Sb$ material, the $In_xGa_{1-x}Sb$ material and the $Al_yGa_{1-y}Sb$ material having a valance band offset that is between about 0.3 eV and 0.6 eV.

13. The apparatus of claim 1, wherein the apparatus is configured and arranged to switch between conductance states in response to a threshold voltage bias applied to the gate electrode, and exhibits a subthreshold slope of approximately between about 60-120 mV/decade.

14. A field-effect transistor comprising:
    a channel region;
    source/drain regions separated by the channel region;
    a dielectric;
    first and second barrier layers separated by the channel region, the second barrier layer being between the dielectric and the channel region, the first and second barrier layers respectively having band gaps that are different than a band gap of the channel region and configured and arranged to confine charge carriers in the channel region in response to an electric field, wherein the channel region is configured and arranged to confine electrons if the electric field corresponds to one of two opposing polarities and holes if the electric field corresponds to the other of the two opposing polarities, the first and second barrier layers further configured and arranged with a crystalline lattice constant that is different than a crystalline lattice constant of the channel region and configured and arranged to introduce strain to the channel region via the lattice constant mismatch;
    an interface layer on the second barrier layer and configured and arranged to mitigate oxidation of the second barrier layer and to form a quantum well with the second barrier layer; and
    a gate electrode separated from the second barrier layer by the dielectric and configured and arranged to apply an electric field to the channel region to switch the channel region between conductance states for electrically coupling the source/drain regions.

15. The field-effect transistor of claim 14, wherein the first barrier layer, second barrier layer and channel region extend into the source/drain regions, and the source/drain regions are doped.

16. The field-effect transistor of claim 14, wherein the channel region is configured and arranged with the dielectric, first and second barrier layers and the gate electrode to exhibit conductance states having a current on/off ratio $I_{on}/I_{off}$ of about or greater than $10^4$ for passing current between the source/drain regions.

17. The field-effect transistor of claim 14, wherein the interface layer is less than about 5 nm thick.

18. A method for manufacturing a semiconductor apparatus, the method comprising:
forming a first barrier layer;
forming a channel region on the first barrier layer;
forming a second barrier layer on the channel region, the barrier layers having band gaps that are different than a band gap of the channel region and being configured and arranged to confine charge carriers in the channel region in response to an electric field, wherein the channel region is configured and arranged to confine electrons if the electric field corresponds to one of two opposing polarities and holes if the electric field corresponds to the other of the two opposing polarities, the barrier layers being formed with a crystalline lattice constant that is different than a crystalline lattice constant of the channel region to introduce strain to the channel region via the lattice constant mismatch;
removing oxides from the second barrier layer;
forming a dielectric over the second barrier layer; and
forming an electrode on the dielectric.

19. The method of claim 18, further including forming an interfacial layer on the second barrier layer, the interfacial layer being configured and arranged to mitigate oxide growth on the second barrier layer.

20. The method of claim 19, wherein forming the interfacial layer includes forming the interfacial layer with a thickness configured and arranged to form a quantum well and magnify an effective bandgap of the interfacial layer.

21. The method of claim 18, wherein forming the channel region and the first and second barrier layers include forming the barrier layers with a crystalline lattice constant that is between about 0.5% and 5.0% different than a crystalline lattice constant of the channel region and, via the mismatch, inducing strain in the channel region.

22. The method of claim 18,
further including forming an arsenic cap layer on the second barrier layer to mitigate oxide formation,
wherein forming a dielectric on the second barrier layer includes, in a vacuum environment, removing the arsenic cap and forming the dielectric.

23. A semiconductor apparatus comprising a channel region and first and second barrier layers separated by the channel region, the first and second barrier layers respectively having band gaps that are different than a band gap of the channel region, the channel region being configured and arranged with the barrier layers to pass charge carriers for n-type and p-type semiconductor devices during inversion in response to an electric field, wherein the channel region is configured and arranged to confine electrons if the electric field corresponds to one of two opposing polarities and holes if the electric field corresponds to the other of the two opposing polarities.

24. The apparatus of claim 23, wherein the first and second barrier layers have a crystalline lattice constant that is different than a crystalline lattice constant of the channel region by an amount that induces about 1% strain in the channel region.

25. The apparatus of claim 23, further including an interfacial layer on the second barrier layer and configured and arranged to form a quantum well with the second barrier layer and mitigate charge response to interface states in the apparatus.

26. The apparatus of claim 23, wherein at least one of the barrier layers is in direct contact with the channel region at an interface and has a crystalline lattice structure at the interface and having a crystalline lattice constant that is sufficiently different than a crystalline lattice constant of the channel region at the interface to induce strain in the channel region of at least 1.0%.

27. A semiconductor apparatus comprising:
a channel region;
a dielectric;
a gate electrode configured and arranged to apply an electric field to the channel region via the dielectric; and
first and second barrier layers separated by the channel region, the second barrier layer being between the dielectric and the channel region, the first and second barrier layers and the channel region respectively being configured and arranged with both different band gaps and to confine electrons and holes in the channel region or with the channel region composed of a material characterized in that the channel region is capable of passing, during inversion, electron carriers when configured with an n-type channel semiconductor device and hole carriers when configured with a p-type channel semiconductor device.

28. The apparatus of claim 27, wherein the first and second barrier layers and the channel region respectively are configured and arranged with both different band gaps and to confine electrons and holes in the channel region and with the channel region composed of a material characterized in that the channel region is capable of passing, during inversion, electron carriers when configured with an n-type channel semiconductor device and hole carriers when configured with a p-type channel semiconductor device.

29. The apparatus of claim 27, wherein the first and second barrier layers have band gaps that are different than a band gap of the channel region and confine both electrons and holes in the channel region, the first and second barrier layers having a crystalline lattice constant that is between about 0.5% and 5.0% different than a crystalline lattice constant of the channel region.

30. The apparatus of claim 27, further including an interfacial layer between the dielectric and the second barrier layer and configured and arranged to mitigate oxidation between the dielectric and the second barrier layer and to separate carriers in the channel from interface traps at an interface with the dielectric.

31. The apparatus of claim 27, wherein the first and second barrier layers have band gaps that are different than a band gap of the channel region and confine both electrons and holes in the channel region, the first and second barrier layers having a crystalline lattice constant that is between about 0.5% and 5.0% different than a crystalline lattice constant of the channel region and being configured and arranged to induce strain in the channel region of at least 1.0%.

32. The apparatus of claim 27, wherein the channel region includes a $In_xGa_{1-x}Sb$ material and the first and second barrier layers include an $Al_yGa_{1-y}Sb$ material, the $In_xGa_{1-x}Sb$ material and the $Al_yGa_{1-y}Sb$ material having a valance band offset that is between about 0.3 eV and 0.6 eV.

33. The apparatus of claim 27, wherein the first and second barrier layers are configured and arranged with a band gap that, relative to a band gap in the channel region, facilitates a carrier mobility in the channel region that is higher than a carrier mobility in the channel region, absent the barrier layers.

34. The apparatus of claim 33, further including an interfacial layer between the dielectric and the second barrier layer and configured and arranged to separate carriers in the channel from interface traps at an interface with the dielectric, and therein increase carrier mobility in the channel region relative to carrier mobility in the channel region absent the interfacial layer.

35. The apparatus of claim 33, wherein the first and second barrier layers are configured and arranged with a crystalline lattice constant that is between about 0.5% and 5.0% different than a crystalline lattice constant of the channel region, and therein introduce at least 1% strain to the channel region, therein increasing carrier mobility of the channel region relative to carrier mobility in the channel region absent the strain.

36. The apparatus of claim 33, wherein the first and second barrier layers are configured and arranged with the channel region, to effect electron and hole mobility in the channel region that is at least seven times electron and hole mobility of a silicon channel under common operating conditions and at a low sheet charge of between about $1\times10^{12}$ cm$^{-2}$ and $2\times10^{12}$ cm$^{-2}$, and electron and hole mobility in the channel region that is at least twice the mobility of a silicon channel under common operating conditions at a high sheet charge of between about $5\times10^{12}$ cm$^{-2}$ and $6\times10^{12}$ cm$^{-2}$.

\* \* \* \* \*